United States Patent
Kobayashi et al.

(10) Patent No.: US 6,497,240 B1
(45) Date of Patent: Dec. 24, 2002

(54) ULTRASOUND CLEANING DEVICE AND RESIST-STRIPPING DEVICE

(75) Inventors: Kazuki Kobayashi, Izumi (JP); Toshiaki Muratani, Yamatokoriyama (JP); Hiroto Yoshioka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/557,052

(22) Filed: Apr. 21, 2000

(30) Foreign Application Priority Data

| Apr. 21, 1999 | (JP) | 11-113823 |
| Apr. 21, 1999 | (JP) | 11-113836 |
| Mar. 27, 2000 | (JP) | 2000-087351 |
| Mar. 27, 2000 | (JP) | 2000-087382 |

(51) Int. Cl.$^7$ .................. B08B 3/10
(52) U.S. Cl. .......... 134/64 R; 134/122 R; 134/902; 134/184; 134/186
(58) Field of Search .......... 134/64 R, 122 R, 134/902, 102.3, 184, 186; 15/302, 320, 321

(56) References Cited

U.S. PATENT DOCUMENTS

| 4,281,431 | A | * | 8/1981 | Nierlich et al. |
| 4,785,588 | A | * | 11/1988 | Woodward |
| 5,185,056 | A | * | 2/1993 | Fuentes et al. |
| 5,335,681 | A | * | 8/1994 | Schmid |
| 5,574,485 | A | * | 11/1996 | Anderson et al |
| 5,601,655 | A | * | 2/1997 | Bok et al. |
| 5,608,943 | A | * | 3/1997 | Konishi et al. |
| 5,651,834 | A | * | 7/1997 | Jon et al. |
| 5,871,584 | A | * | 2/1999 | Tateyama et al. |
| 5,881,750 | A | * | 3/1999 | Yoshitani |
| 5,939,139 | A | * | 8/1999 | Fujimoto |
| 5,952,050 | A | * | 9/1999 | Doan |
| 5,975,098 | A | * | 11/1999 | Yoshitani et al. |
| 6,003,527 | A | * | 12/1999 | Netsu et al. |
| 6,059,919 | A | * | 5/2000 | Schneider et al. |
| 6,079,428 | A | * | 6/2000 | Anai |
| 6,092,937 | A | * | 7/2000 | Snodgrass et al. |
| 6,230,722 | B1 | * | 5/2001 | Mitsumori et al. |
| 6,260,562 | B1 | * | 7/2001 | Morinish et al. |
| 6,343,609 | B1 | * | 2/2002 | Kim |

FOREIGN PATENT DOCUMENTS

| JP | 1-95521 | * | 4/1989 | |
| JP | 1-111337 | * | 4/1989 | |
| JP | 1-259536 | * | 10/1989 | |
| JP | 2-194619 | * | 8/1990 | |
| JP | 4-71232 | * | 3/1992 | |
| JP | 06-029276 | | 2/1994 | ......... H01L/21/304 |
| JP | 7-8880 | | 1/1995 | |
| JP | 7-263336 | | 10/1995 | |
| JP | 7-284715 | | 10/1995 | |
| JP | 7-328573 | | 12/1995 | |
| JP | 08-019766 | | 1/1996 | ............. B08B/7/00 |
| JP | 8-187474 | | 7/1996 | |
| JP | 09-134872 | | 5/1997 | ......... H01L/21/027 |
| JP | 9-321010 | | 12/1997 | |
| JP | 10-106998 | | 4/1998 | |
| JP | 10-177978 | | 6/1998 | |
| JP | 10-296200 | | 11/1998 | |
| JP | 11-029794 | | 2/1999 | ............. C11D/7/02 |
| JP | 11-76962 | | 3/1999 | |

\* cited by examiner

*Primary Examiner*—Frankie L. Stinson
(74) *Attorney, Agent, or Firm*—Dike, Bronstein, Roberts & Cushman IP Group Edwards & Angell, LLP; David G. Conlin; George W. Hartnell, III

(57) ABSTRACT

To provide an ultrasonic cleaning device (1) that ensures stable operation of a vibrating element for generating ultrasonic without a complex structure and distribution of a great quantity of a cleaning liquid and (2) that is capable of cleaning upper and lower surfaces of a cleaning target easily, an ultrasonic cleaning section of the device is provided with an upper cleaning-liquid-supply nozzle and a lower cleaning-liquid-supply nozzle for projection of ultrasonic. The upper cleaning-liquid-supply nozzle supplies an upper surface cleaning liquid to an upper surface of a glass substrate. The lower cleaning-liquid-supply nozzle supplies the lower surface cleaning liquid to a lower surface of the substrate in a form of shower to which ultrasonic has been projected. A vibrating element for generating ultrasonic to be projected to the lower surface cleaning liquid is provided in a cleaning liquid distribution path that extends from an upstream side to a downstream side in a direction in a range of a horizontal direction to an upward direction.

11 Claims, 9 Drawing Sheets

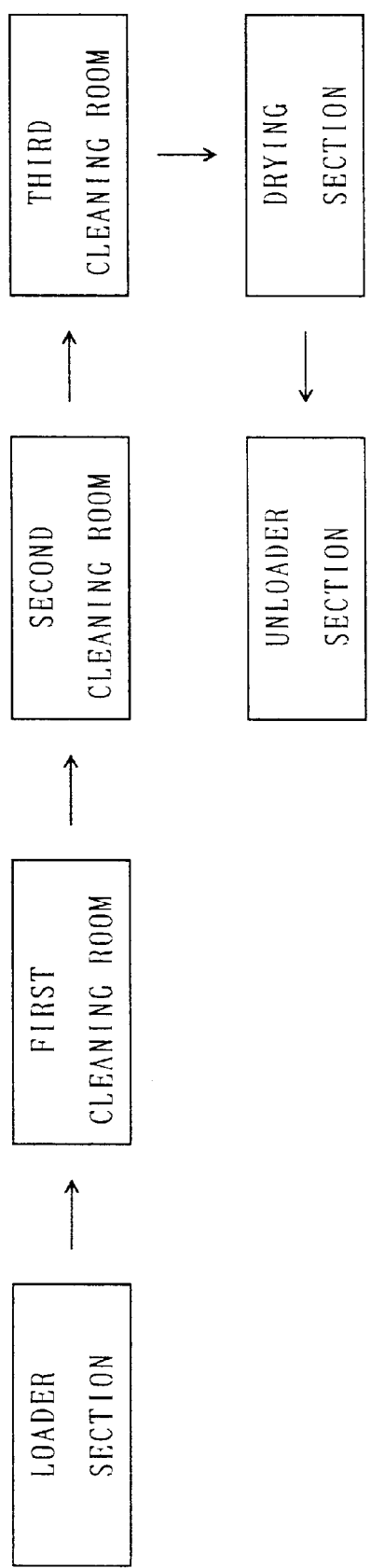
F I G. 2

TRAVELLING DIRECTION

ULTRASOUND CLEANING DEVICE AND RESIST-STRIPPING DEVICE

FIELD OF THE INVENTION

The present invention relates to an ultrasonic cleaning device for applying an ultrasonic treatment to a processing target. More specifically, the present invention relates to (1) an ultrasonic cleaning device and method used in a fabrication process of a flat display panel such as a liquid crystal display element or a PDP (plasma display panel) or in a fabrication process of a semiconductor substrate, and (2) a resist-stripping device for stripping and removing a resist by utilizing ultrasonic, for example, a resist-stripping device for stripping and removing a photoresist used in photolithography and the like in a liquid crystal display device fabrication process.

BACKGROUND OF THE INVENTION

A cleaning part of an ultrasonic cleaning device of a conventional single substrate dipping type, that is used in a fabrication process of a flat panel display such as a liquid crystal display element or a PDP or in a fabrication process of a semiconductor substrate is provided with a vibrating element having a vibrating plate or the like, in a lower part of a cleaning bath that reservoirs a cleaning liquid. By operating a stripping element in a state in which a cleaning target such as a substrate is dipped in the cleaning liquid, ultrasonic vibration is applied to the cleaning liquid, so that the cleaning target is subjected to the ultrasonic cleaning treatment.

The foregoing ultrasonic cleaning device, however, requires a large quantity of a cleaning liquid. Besides, since the cleaning liquid in the cleaning bath is replaced regularly at predetermined intervals, there is possibility that the cleaning of a target would be insufficient. Furthermore, upon the cleaning treatment, transport of a target has to be suspended while the target is dipped into the cleaning liquid, thereby causing a longer time to be spent for the treatment.

On the other hand, the cleaning part of the ultrasonic cleaning device of a conventional single substrate type in which a cleaning liquid is supplied to a cleaning target by means of an ultrasonic cleaning nozzle is provided with an ultrasonic cleaning nozzle 102, above a substrate 101 that is the cleaning target, as shown in FIG. 10. A cleaning liquid (pure water, in the most cases) 103 to which ultrasonic has been projected (applied) is sprayed over an upper surface of the substrate 101, which is transported while being horizontally kept. In so doing, particles of organic materials, metallic materials, etc. adhering to the substrate 101 are removed, so that the surface is cleaned. Besides, the vibrating element for generating the ultrasonic to be projected to the cleaning liquid is usually provided inside the ultrasonic cleaning nozzle 102, or occasionally in a cleaning-liquid-supply pipe that connects the ultrasonic cleaning nozzle 102 with a cleaning-liquid-supply pump provided on an upstream side to the ultrasonic cleaning nozzle 102.

Usually applied as a method for spraying the cleaning liquid 103 is a showering method in which the cleaning liquid 103 is sprayed in a shower form with a width equal to or broader than that of the substrate 101 while ultrasonic is projected to the cleaning liquid 103 by the vibrating element.

According to the foregoing arrangement, the cleaning treatment of the substrate 101 is carried out always with the fresh cleaning liquid 103 (in the case where the cleaning liquid 103 is not collected and reused). Besides, the cleaning treatment to the substrate 101 can be carried out while the substrate 101 is being transported by transport rollers (not show) or the like.

Incidentally, the foregoing vibrating element is damaged or broken within a short period of time due to heat unless it is operated in a liquid having no bubbles. Therefore, when generating the ultrasonic, the vibrating element need be sufficiently surrounded by a liquid such as the cleaning liquid 103.

The aforementioned conventional ultrasonic cleaning device, however, has a nozzle opening 102a facing downwards above the substrate 101 as the cleaning target, and is arranged so that the cleaning liquid 103 is jetted downwards through the nozzle opening 102a. Therefore, bubbles likely intrude therein through the nozzle opening 102a. Besides, the distribution path of the cleaning liquid 103 (more specifically, the ultrasonic cleaning nozzle 102, the cleaning-liquid-supply pipe, the cleaning-liquid-supply pump, etc.) extends downwards or diagonally downwards, and bubbles generated upon operation of the vibrating element provided in the distribution path (more specifically, inside the ultrasonic cleaning nozzle 102) tend to remain therearound. Moreover, the bubbles having intruded therein are hardly discharged to outside the distribution path of the cleaning liquid 103.

Therefore, to flow the cleaning liquid 103 so as to prevent bubbles from remaining around the vibrating element, a complex structure is required, which is characterized as follows, for instance: (1) a plurality of cleaning liquid distribution paths are provided inside the ultrasonic cleaning nozzle 102; and (2) the inside wall of the ultrasonic cleaning nozzle 102 is formed in a tapered shape. Besides, to discharge bubbles through the nozzle opening 102a, it is necessary to flow a great quantity of the cleaning liquid 103 at all times, with the opening area of the nozzle opening 102a and the like taken into consideration. These problems have become severer as the substrate (cleaning target: processing target) 101 becomes larger in size. Furthermore, in the case of the above-described conventional ultrasonic cleaning device, to clean both the surfaces of the substrate 101 simultaneously is impossible, although to flow a great quantity of the cleaning liquid 103 is required.

Besides, the resist stripping treatment for stripping the resist applied on the substrate is either (1) a batch type in which a plurality of substrates are simultaneously subjected to the resist stripping treatment, or (2) a single substrate type in which the substrates are subjected to the resist stripping treatment one by one. The batch type, processing a plurality of substrates simultaneously, has an advantage of a higher processing capacity. As the substrate treated becomes larger in size, however, a quantity of an organic solvent or the like reservoired as a resist stripper in a stripping treatment bath increases. Thus, there are also problems regarding safety.

On the other hand, methods for the resist stripping treatment of the single substrate type include, generally, (1) a dipping method in which a substrate is dipped in a stripping treatment bath reservoiring a resist stripper, (2) a showering method in which a resist-applied surface of a substrate is sprayed with a resist stripper, and (3) a method in which the methods of the foregoing two types are used in combination. In some arrangements for the dipping method, an ultrasonic vibrating plate is provided at the bottom of the stripping treatment bath.

The single-substrate-type method is advantageous, particularly for a large substrate with a diagonal of not less than 1 m, in that a quantity of an organic solvent used is smaller as compared with that in the case of the foregoing batch type since the substrates are treated one by one. The time spent in the resist stripping treatment, however, becomes a rate-limiting factor, and therefore, the processing capacity of the single-substrate-type method is generally smaller than that of the batch-type method.

To improve the processing capacity of a device of the single substrate type, a processing chamber for stripping resist (stripping section) may be designed long, for example. Designing the processing chamber long, however, leads to problems of causing a device footprint larger and of increasing an organic solvent used, thereby impairing the advantage of the single substrate type. In the case of an arrangement for the dipping method, an ultrasonic vibrating plate is provided at the bottom of a stripping treatment bath, improvement of the resist stripping performance by utilizing the ultrasonic vibration is expected, but similar problems such as an increase in usage of an organic solvent arise since substrates to be processed are required to be dipped in the stripping treatment bath.

Any one of the foregoing methods (1) through (3) of the single substrate type is a method recycling and re-using the resist stripper, and requires provision of a circulation-use tank capable of reservoiring a certain quantity of a resist stripper (organic solvent), though the quantity is smaller than that in the case of the batch type. Therefore, this leads to problems such as spatial loss, and an increase in possibility of danger.

Regarding the single-substrate-type resist-stripping device, to improve a rate of the resist stripping treatment without damaging a resist-applied matter to make the device footprint and the length of the stripping section (device length) as small as possible is a task relevant to effective usage of a clean room space and indispensable for reducing the device costs. Besides, reduction of usage of a resist stripper, typically an organic solvent, closely relates not only to reduction of costs of raw materials and costs for processing a waste fluid, but also to solution of environmental problems such as reduction of a total amount of industrial waste, and it is therefore an important task that must be accomplished by the industrial world in the near future.

SUMMARY OF THE INVENTION

The present invention was made to solve the foregoing problems, and the object of the present invention is to provide an ultrasonic cleaning device ensuring stable operation of a vibrating element for generating ultrasonic without a complex structure and distribution of a great quantity of a cleaning liquid, thereby allowing device costs and device running costs to decrease.

To achieve the foregoing object, an ultrasonic cleaning device in accordance with the present invention is arranged so as to include an ultrasonic cleaning section having cleaning-liquid-supply means for supplying an ultrasonic-applied cleaning liquid to a cleaning target through a cleaning-liquid-supply opening, wherein (1) the ultrasonic cleaning section includes a vibrating element for generating ultrasonic in a cleaning liquid distribution path, at a position on an upstream side to the cleaning-liquid-supply opening, and (2) a part of the cleaning liquid distribution path immediately on a downstream side to the vibrating element extends from an upstream side to a downstream side in a direction in a range of a horizontal direction to an upward direction.

According to the foregoing arrangement, the part of the cleaning liquid distribution path positioned immediately on the downstream side to the vibrating element extends in a direction in a range of the diagonally upward direction to the upward direction. Therefore, bubbles generated upon operation of the vibrating element are easily discharged onto the downstream side of the distribution path along the flow of the cleaning liquid. Besides, bubbles intruding through the cleaning-liquid-supply opening or bubbles once discharged on the downstream side of the distribution path do not intrude in the vicinity of the vibrating element.

Therefore, a quantity of the cleaning liquid needed to discharge the bubbles in the vicinity of the vibrating element onto the downstream side of the distribution path can be drastically decreased. Additionally, a specific device for preventing bubbles from remaining in the vicinity of the vibrating element need not be provided, thereby ensuring remarkable simplification of the structure of the ultrasonic cleaning device.

Another object of the present invention is to provide a cleaning method enabling to clean upper and lower surfaces of a cleaning target more easily.

To achieve the foregoing object, a cleaning method in accordance with the present invention is a method including the steps of (1) supplying an upper surface cleaning liquid to an upper surface of a cleaning target, and (2) supplying an ultrasonic-applied cleaning liquid to a lower surface of the cleaning target supplied with the upper surface cleaning liquid.

According to the foregoing method, the ultrasonic-applied cleaning liquid is supplied to the lower surface of the cleaning target in a state in which a layer of the upper surface cleaning liquid is formed on the upper surface of the cleaning target. The vibration transmitted to the lower surface of the cleaning target is further transmitted to the upper surface side without attenuation, thereby ensuring that not only particles adhering to the lower surface but also those adhering to the upper surface can be simultaneously removed by means of the cleaning liquid and the ultrasonic. In short, an effect is achieved that a cleaning method capable of easily cleaning both the upper and lower surfaces of the cleaning target.

Still another object of the present invention is to provide a single-substrate-type resist-stripping device that is capable of carrying out a resist-stripping treatment at a high rate without damaging a resist-applied matter and that has a shorter device length and a smaller footprint.

To achieve the foregoing object, the resist-stripping device in accordance with the present invention is arranged so as to include a stripping section, wherein the stripping section includes (1) stripper-supply means for supplying a resist stripper to a resist-applied surface of a resist-applied matter, the resist stripper stripping a resist on the resist-applied surface, and (2) liquid-supply means for supplying an ultrasonic-applied liquid to a back surface opposite to the resist-applied surface supplied with the resist stripper.

According to the foregoing arrangement, the resist stripper is supplied to the resist-applied surface by the stripper-supply means. Subsequently, the ultrasonic-applied liquid is supplied by the liquid-supply means to the back surface opposite to the resist-applied surface. The ultrasonic vibration transmitted to the back surface is further transmitted to the resist stripper on the resist-applied surface via the inside of the resist-applied matter. Consequently, the stripping of the resist from the resist-applied surface and the dissolution of the resist into the stripper is promoted, resulting in drastic reduction of the time required for the resist stripping treatment (the processing performance can be drastically improved). Besides, usage of the resist stripper can be reduced. As a result, the resist-stripping device can be made shorter in length, the footprint thereof can be made smaller, and the usage of the resist stripper can be reduced.

Furthermore, since the ultrasonic vibration is indirectly transmitted to the resist-applied surface side, another effect can be achieved that only the resist can be stripped without damaging the structure (circuit patterns, etc.) formed on the resist-applied surface, as compared with the case where the ultrasonic vibration is applied directly to the resist-applied surface side.

For a fuller understanding of the nature and advantages of the invention, reference should be made to the ensuing detailed description taken in conjunction with the accompanying drawings.

BRIEF DESCRIPTION OF THE DRAWINGS

FIG. 2 is an explanatory view illustrating an arrangement of the ultrasonic cleaning device in accordance with the embodiment of the present invention.

DESCRIPTION OF THE PREFERRED EMBODIMENTS

First Embodiment

Figure 1:
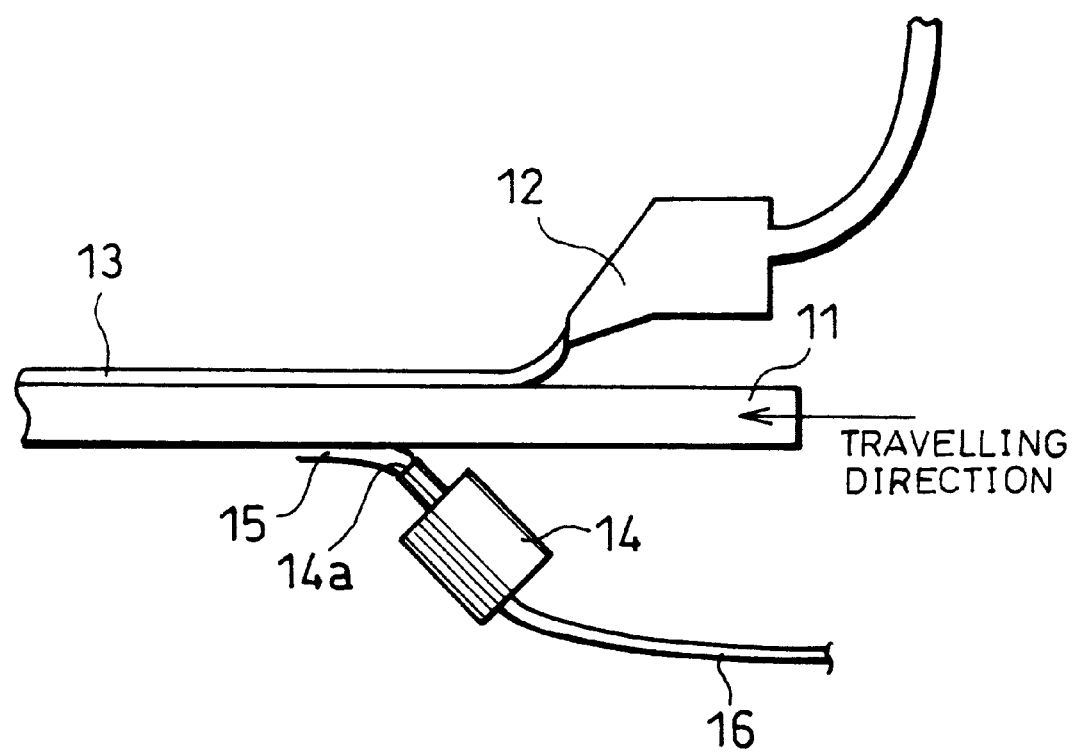
FIG. 1 is a side view schematically illustrating an arrangement of an ultrasonic cleaning section of an ultrasonic cleaning device in accordance with an embodiment of the present invention.
Figure 3:
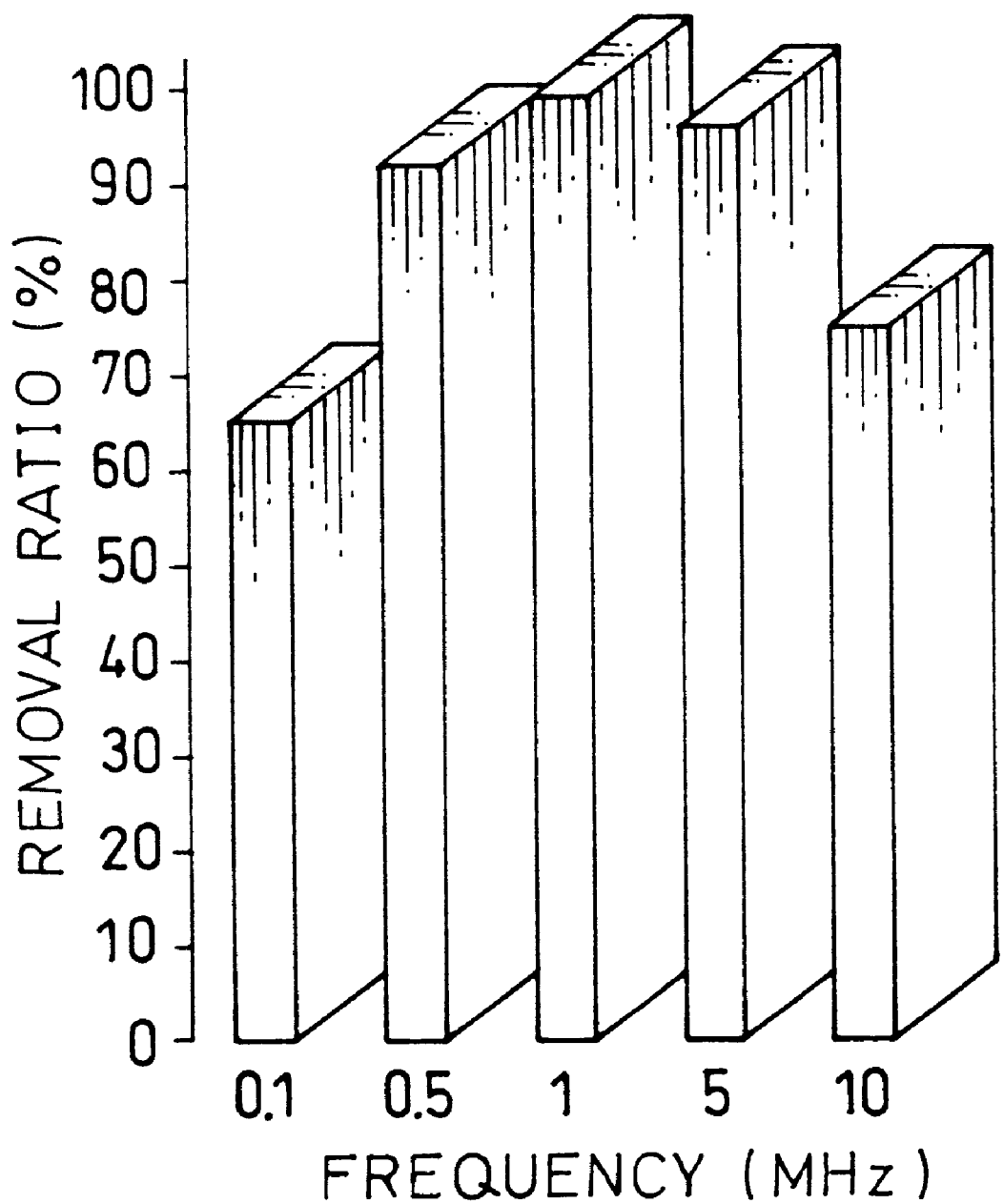
FIG. 3 is a graph showing relationship between the frequency of ultrasonic projected to a lower surface cleaning liquid and the rate of removal of particles adhering to a substrate.

The following description will explain an embodiment of the present invention while referring to FIGS. 1 through 3. This however does not limit the present invention.

An ultrasonic cleaning device in accordance with the present embodiment is used in, for example, the fabrication process of a liquid crystal display element, and is composed of, as shown in FIG. 2, a loader section, a first cleaning room, a second cleaning room, a third cleaning room, a drying section, and an unloader section that are provided in the stated order from an upstream side to a downstream side in a direction of transport of a glass substrate 11 (see FIG. 1). Incidentally, the first cleaning room, the second cleaning room, and the third cleaning room (ultrasonic cleaning section) are hereinafter collectively referred to as a cleaning section.

The foregoing loader section takes out glass substrates 11 one by one consecutively from a transport-use cassette capable of storing a plurality of the glass substrates 11 (for example, 20 pieces), and sends the same in a horizontal state out to the cleaning section at constant intervals. The rate of transport of the glass substrates 11 (only one piece is shown) is 600 mm/min., which is common in all the units in the ultrasonic cleaning device.

The cleaning treatment of the glass substrate 11 transported from the loader section to the cleaning section is carried out in the following manner. First, it is cleaned by means of a disk-form brush in the first cleaning room, which is located at the most upstream side in the transport direction. Here, particles (fine particles) of organic matters, metals, etc., having diameters of not less than 5 $\mu$m are removed. Then, in the second cleaning room next in the downstream side thereto in the transport direction, particles having diameters of about from 3 $\mu$m to 5 $\mu$m are removed by high-pressure jet cleaning. Finally, in the third cleaning room located in the most downstream side in the transport direction, particles having diameters of about from 1 $\mu$m to 3 $\mu$m are removed.

The foregoing third cleaning room includes, as shown in FIG. 1, an upper cleaning-liquid-supply nozzle 12 provided above the glass substrate 11 as a cleaning target, and a lower cleaning-liquid-supply nozzle (cleaning-liquid-supply means) 14 provided below the glass substrate 11. Incidentally, "above the glass substrate 11" and "below the glass substrate 11" define the same as "above the transport means for transporting the glass substrate 11" and "below the transport means for transporting the glass substrate 11", respectively.

The lower cleaning-liquid-supply nozzle 14 is provided on the downstream side in the glass substrate 11 transport (travelling) direction with respect to the upper cleaning-liquid-supply nozzle 12. Incidentally, a position of the upper cleaning-liquid-supply nozzle 12 is not particularly limited as long as the same is provided not on the downstream side in the glass substrate 11 transport direction with respect to the lower cleaning-liquid-supply nozzle 14. More specifically, the upper cleaning-liquid-supply nozzle 12 may be provided exactly above the lower cleaning-liquid-supply nozzle 14.

The upper cleaning-liquid-supply nozzle 12 has a nozzle opening in a slit form, to supply pure water as upper surface cleaning liquid 13 to an upper surface of the glass substrate 11 horizontally transported. On the other hand, the lower cleaning-liquid-supply nozzle 14 is to supply pure water as lower surface cleaning liquid (cleaning liquid) 15 to a lower surface of the glass substrate 11, in a line-form shower to which ultrasonic of a frequency of 1 MHz, for example, is projected. In other words, in the third cleaning room, pure water as the upper surface cleaning liquid 13 is, from above, flown over the glass substrate 11, while line-form ultrasonic shower is applied thereto from below, so that both the upper and lower surfaces of the glass substrate 11 are simultaneously cleaned.

The shape of the nozzle opening of the upper cleaning-liquid-supply nozzle 12 is not particularly limited to the aforementioned shape, but preferably has a length substantially equal to the width of the glass substrate 11, since this makes it easy to uniformly supply the upper surface cleaning liquid 13 over the upper surface of the glass substrate 11. Besides, depending on conditions, the upper cleaning-liquid-supply nozzle 12 may be replaced with a cleaning liquid jet-out/spray device for jetting out/spraying the upper surface cleaning liquid 13 in a shower form.

Further, the direction in that the nozzle opening of the upper cleaning-liquid-supply nozzle 12 faces is not particularly limited. For example, as shown in FIG. 1, the nozzle opening may be substantially vertical to the upper surface of the glass substrate 11, or may face (substantially parallel with) the upper surface of the glass substrate 11.

A method for forming a layer of the upper surface cleaning liquid 13 on the upper surface of the glass substrate 11 (i.e., a method for supplying the upper surface cleaning liquid 13) is not limited to the foregoing example. More specifically, for example, another following method may be applied: another cleaning liquid bath for reservoiring the cleaning liquid 13 is provided, and the glass substrate 11 is dipped in the cleaning liquid in the cleaning liquid bath, taken out, and then horizontally transported.

The lower cleaning-liquid-supply nozzle 14, as described above, supplies the ultrasonic-applied lower surface cleaning liquid to the lower surface of the glass substrate 11 through a cleaning-liquid-supply opening 14a as the nozzle opening. Therefore, the structure of the lower cleaning-liquid-supply nozzle 14 is not particularly limited except that the cleaning-liquid-supply opening 14a is provided so that the lower surface cleaning liquid 15 is supplied upwards or diagonally upwards. Besides, the cleaning-liquid-supply means is not necessarily in a nozzle shape and may take any shape as long as it has a cleaning-liquid-supply opening. More specifically, it may be of a normal shower type (with slits).

A vibrating element (not shown) operated upon supply of the lower surface cleaning liquid 15 and generating (projecting) ultrasonic to the lower surface cleaning liquid 15 is disposed in the distribution path of the lower surface cleaning liquid 15 (normally inside the lower cleaning-liquid-supply nozzle 14), on the upstream side to the cleaning-liquid-supply opening 14a of the lower cleaning-liquid-supply nozzle 14 (i.e., on the upstream side with reference to the distribution direction of the lower surface cleaning liquid 15). The distribution path concretely refers to a structure reaching the cleaning-liquid-supply opening 14a that includes a cleaning-liquid-supply pump (not shown), the cleaning-liquid-supply pipe 16, the lower cleaning-liquid-supply nozzle 14, and the like. The distribution path may have a structure such that a part located immediately on the downstream side to the vibrating element extends, from the upstream side to the downstream side, in any direction in a range of a horizontal direction to an upward direction.

Since the part of the distribution path immediately on the downstream side to the vibrating element extends in the aforementioned direction, bubbles generated upon operation of the vibrating element are easily discharged to the downstream side by the lower surface cleaning liquid 15 when the lower surface cleaning liquid 15 is being supplied. Besides, the bubbles once discharged to the downstream side to the vibrating element do not intrude back into around the vibrating element.

Furthermore, since the cleaning-liquid-supply opening 14a is provided so as to supply the lower surface cleaning liquid 15 in a direction in a range of a diagonally upward direction to an upward direction (i.e., toward the lower surface of the glass substrate 11), bubbles unlikely intrude through the cleaning-liquid-supply opening 14a. Therefore, upon supply of the lower surface cleaning liquid 15, bubbles hardly intrude into and remain around the vibrating element provided inside the distribution path on the upstream side to the cleaning-liquid-supply opening 14a. Consequently, there is no possibility that the vibrating element would be damaged or broken by heat.

Incidentally, in the case where the vibrating element is provided, for example, in the lower cleaning-liquid-supply nozzle 14, the cleaning-liquid-supply pipe 16 and the like located on the upstream side thereto may be arranged so as to, from the upstream side to the downstream side, extend (diagonally) downwards, depending on conditions. To surely prevent the intrusion and remaining of bubbles around the vibrating element, however, it is preferable that, as shown in FIG. 1, (1) the lower cleaning-liquid-supply nozzle 14 is provided so as to, from the upstream side to the downstream side, extend in a direction in a range of the diagonally upward direction to the upward direction, and (2) the cleaning-liquid-supply pipe 16 and the like disposed on the upstream side to the lower cleaning-liquid-supply nozzle 14 preferably extends horizontally or in a (diagonally) upward direction from the upstream side to the downstream side.

The frequency of oscillation of the foregoing vibrating element, that is, the frequency of ultrasonic projected onto the lower surface cleaning liquid 15 is not particularly limited, and a frequency in a range of several hundred kHz to several MHz is used, for instance. A frequency in a range of 0.1 MHz to 10 MHz is however preferable since a high particle removing capability is obtained with that frequency. Furthermore, the frequency is more preferably in a range of 0.5 MHz to 5 MHz, and further more preferable in a range of 1.0 MHz to 2.0 MHz. More specifically, as shown in FIG. 3, the frequency of the ultrasonic projected to the lower surface cleaning liquid 15 is in a range of 0.5 MHz to 5 MHz, 99% of particles adhering to the glass substrate 11 can be removed. Additionally, in the case where the ultrasonic has a frequency in the foregoing range (0.1 MHz to 10 MHz), there is no possibility that it would damage a cleaning target.

Normally, the same material is adapted as the upper surface cleaning liquid 13 and the lower surface cleaning liquid 15. Concrete examples used as the upper and lower surface cleaning liquids 13 and 15 include conventional known cleaning liquids used in ultrasonic cleaning, such as pure water, ultrapure water, hydrogen water, ozone water, a dilute hydrofluoric acid aqueous solution, and a surfactant solution.

Timings of supply of the upper and lower surface cleaning liquids 13 and 15 to the upper and lower surfaces of the glass substrate 11, respectively, are not particularly limited. For example, taking as an example the case where the upper surface cleaning liquid 13 to the glass substrate 11 transported, the operation may be controlled so that the upper surface cleaning liquid 13 should be supplied only when the glass substrate 11 comes to below the nozzle opening of the upper cleaning-liquid-supply nozzle 12. Such timing control enables further reduction of usage of the upper surface cleaning liquid 13. To more accurately control the timings of supply of the upper and lower surface cleaning liquids 13 and 15, a substrate position detecting sensor or the like may be additionally provided. Note that, depending on conditions, the glass substrate 11 is not necessarily being transported, but may be stopped.

Besides, depending on conditions, the structure may be such that a plurality of the upper and lower cleaning nozzles 12 and 14 are alternately provided in the glass substrate 11 transport direction so that the glass substrate 11 should be cleaned with the upper surface cleaning liquid 13 supplied onto the upper surface of the glass substrate 11, then with the lower surface cleaning liquid 15 supplied to the lower surface of the glass substrate 11, and subsequently with the upper surface cleaning liquid 13 supplied onto the upper surface of the glass substrate 11.

The glass substrates 11 thus cleaned by the foregoing cleaning section are transported into the drying section (see FIG. 2), where they are dried by air knife drying. Subsequently, the glass substrates 11 are one by one housed in a cassette, with which the cleaning treatment with respect to the glass substrates 11 is finished.

According to the arrangement of the ultrasonic cleaning device in accordance with the present embodiment, the ultrasonic vibration transmitted to the lower surface of the cleaning target is further transmitted through a solid such as the glass substrate 11 or a silicon wafer as the cleaning target, substantially without attenuation. Therefore, the vibration transmitted to the lower surface of the cleaning target is further transmitted to the upper surface side without attenuation, thereby ensuring that not only particles adhering to the lower surface but also those adhering to the upper surface can be simultaneously removed in the same manner as in the case of the conventional ultrasonic cleaning device. In short, both the surfaces of the cleaning target transported are cleaned in the same manner, irrespective of which surface faces upwards or downwards.

Furthermore, a quantity of the lower surface cleaning liquid 15 needed to have the vibrating element surrounded by the lower surface cleaning liquid 15 (that is, to prevent intrusion and remaining of bubbles around the vibrating element) can be drastically decreased, thereby resulting in that the running costs can be reduced. Additionally, a specific device for preventing bubbles from intruding and remaining in the vicinity of the vibrating element need not be provided, thereby ensuring remarkable simplification of the structure of the ultrasonic cleaning device (particularly, the structure of the vibrating element section). Consequently, the device costs can be reduced.

Figure 10:
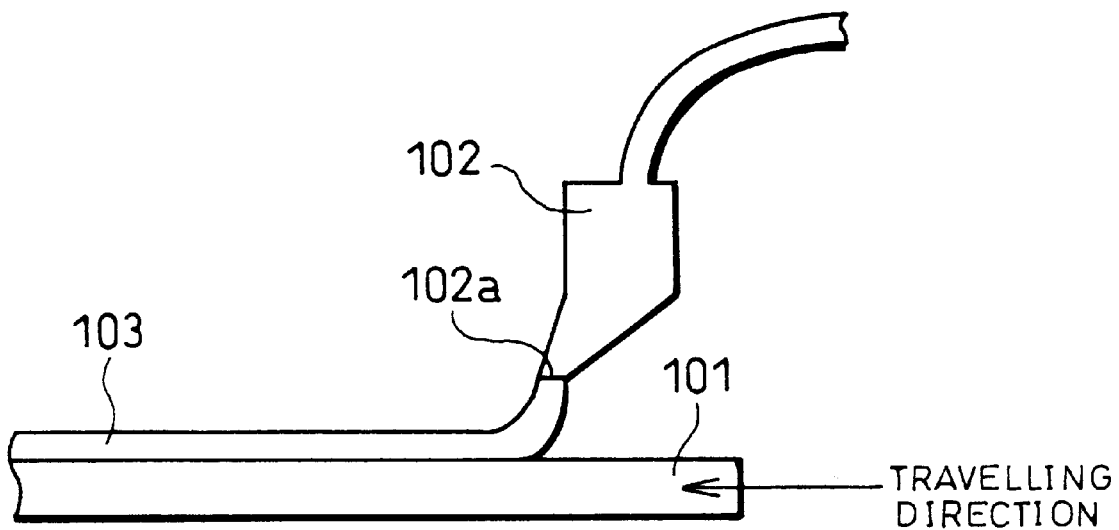
FIG. 10 is a side view schematically illustrating an arrangement of an ultrasonic cleaning section of a conventional shower-type ultrasonic cleaning device.

More specifically, to more stably operate the ultrasonic unit having an opening in the 2 mm×100 mm slit form (corresponding to the ultrasonic cleaning nozzle 102 shown in FIG. 10 and the lower cleaning-liquid-supply nozzle 14 shown in FIG. 1), it is necessary to supply a cleaning liquid at a rate of 10 L/min. to 15 L/min. in the case of the conventional shower-type ultrasonic cleaning device, whereas the cleaning liquid may be supplied at a rate of 1 L/min. according to the arrangement of the ultrasonic cleaning device of the present invention.

Table 1 shows respective quantities (unit: L/min.) of a cleaning liquid (the upper surface cleaning liquid, the lower surface cleaning liquid, and both in total per unit time) required to clean a certain determined area by means of the conventional shower-type ultrasonic device (in which the cleaning liquid is supplied only onto an upper surface of a substrate; in Table 1, referred to as CONVENTIONAL DEVICE) and by means of the ultrasonic cleaning device of the present invention (in Table 1, referred to as PRESENT INVENTION). Taking into consideration that the time required for the cleaning treatment is substantially the same regarding the foregoing two devices, it is obvious that the device of the present invention could clean both the upper and lower surfaces of a substrate with the cleaning liquid of about ¼ or less of the quantity of the same in the case of the conventional device, irrespective of the size of the substrate.

Incidentally, provision of (1) recovering means for recovering the cleaning liquid supplied to the substrate (corresponding to the upper surface cleaning liquid 13 and the lower surface cleaning liquid 15 in FIG. 1) and (2) filtering means for filtering the recovered cleaning liquid enables recycle and re-use of the cleaning liquid, and hence, reduction of usage of the cleaning liquid.

The foregoing arrangement is applicable at a step in which the cleanness of one surface of a substrate does not particularly matter. More specifically, a substrate may be transported in a state in which a surface requiring a higher cleanness faces upwards, and the cleaning liquid supplied to the substrate may be recovered and filtered so as to be thereafter used as the cleaning liquid supplied to the lower surface.

Table 1 below also shows quantities of a cleaning liquid required (total quantities required to clean both the upper and lower surfaces per unit time) (unit: L/min.) by means of the ultrasonic cleaning device of the present invention in the case where the cleaning liquid is re-used (RE-USE TYPE).

TABLE 1

| SUBSTRATE | PRESENT INVENTION | | | | |
|---|---|---|---|---|---|
| SIZE (mm) | UPPER SURFACE | LOWER SURFACE | TOTAL | RE-USE TYPE | CONVENTIONAL DEVICE |
| 300 × 400 | 4 | 3 | 7 | 4 | 30 |
| 360 × 460 | 5 | 4 | 9 | 5 | 40 |
| 550 × 650 | 9 | 6 | 15 | 9 | 60 |

Second Embodiment

Figure 4:
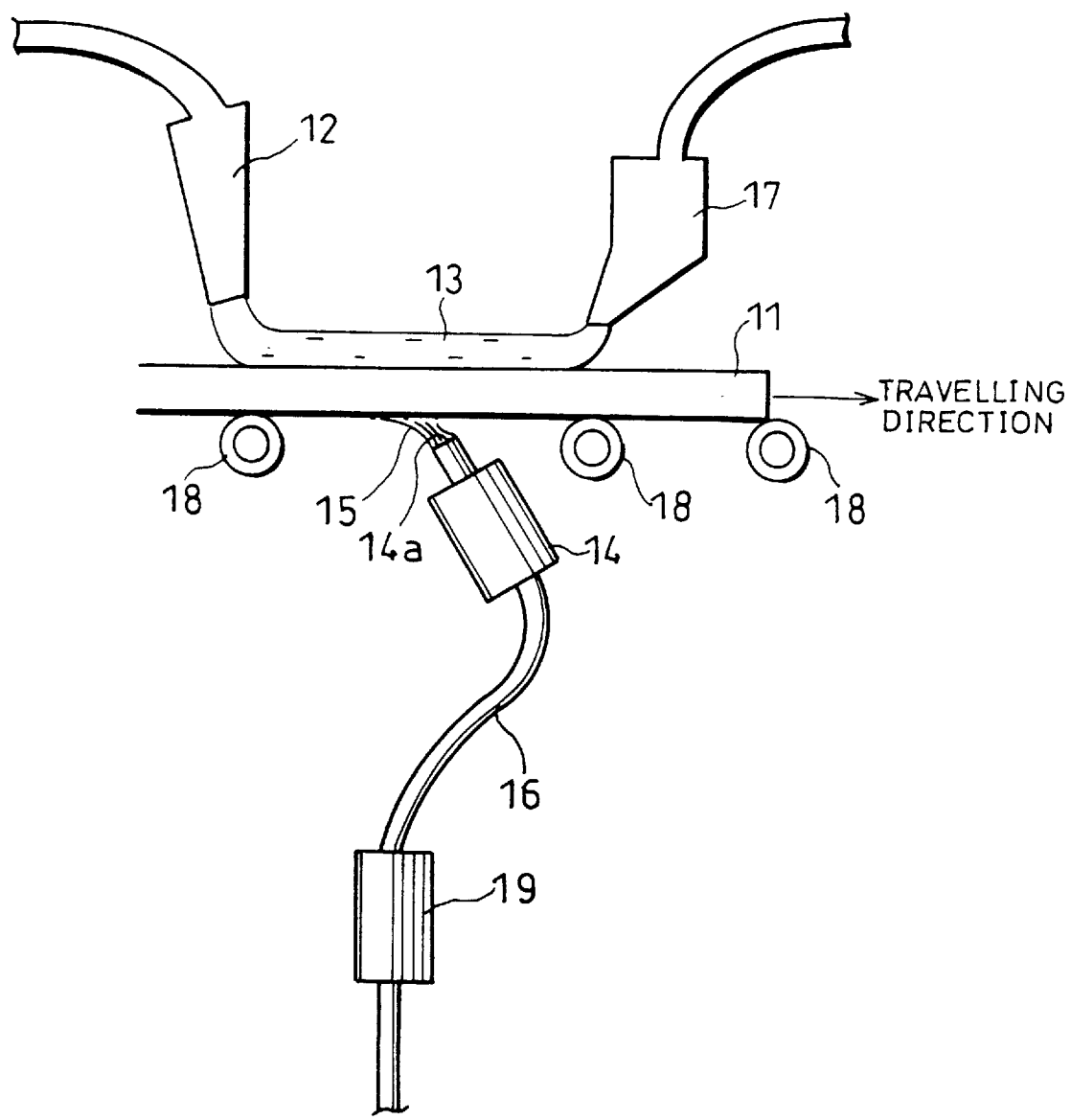
FIG. 4 is a side view schematically illustrating an arrangement of an ultrasonic cleaning section of an ultrasonic cleaning device in accordance with another embodiment of the present invention.

The following description will explain another embodiment of the present invention while referring to FIG. 4. This however does not limit the present invention. The members having the same structure (function) as those in the first embodiment will be designated by the same reference numerals and their description will be omitted.

The present embodiment differs from the first embodiment mainly in the following points: the third cleaning room further includes (1) an upper cleaning-liquid-sucking nozzle (cleaning-liquid-removing means: sucking and removing means) 17 provided above the glass substrate 11 as a cleaning target (i.e., above transport rollers 18 as transport means), and (2) cleaning liquid heating means 19 provided in the cleaning-liquid-supply pipe 16.

The upper cleaning-liquid-sucking nozzle 17 is disposed on a downstream side in the glass substrate 11 transport (travelling) direction with respect to the upper cleaning-liquid-supply nozzle 12 and the lower cleaning-liquid-supply nozzle 14. Since the upper cleaning-liquid-supply nozzle 12 is positioned on the upstream side in the glass substrate 11 transport direction with respect to the lower cleaning-liquid-supply nozzle 14, the foregoing arrangement results in that the upper cleaning-liquid-supply nozzle 12, the lower cleaning-liquid-supply nozzle 14, and the upper cleaning-liquid-sucking nozzle 17 are arranged in the stated order from the upstream side to the downstream side in the transport direction.

The cleaning of the glass substrate 11 is executed basically in the same manner as that in the first embodiment. More specifically, the upper surface cleaning liquid 13 is supplied to the upper surface of the glass substrate 11 through the upper cleaning-liquid-supply nozzle 12. Then, in a state in which a layer of the upper surface cleaning liquid 13 is formed on the upper surface of the glass substrate 11, the ultrasonic-applied lower surface cleaning liquid 15 is supplied to the lower surface of the glass substrate 11. This ensures that ultrasonic vibration is transmitted to not only the lower surface side of the glass substrate 11 but also the upper surface side of the glass substrate 11, thereby enabling the ultrasonic cleaning of both the upper and lower surfaces of the glass substrate 11.

In the present embodiment, the lower surface cleaning liquid 15 supplied to the glass substrate 11 is heated beforehand by the cleaning liquid heating means 19. Therefore, in the case where particles adhering to the substrate 11 are organic substances, the time required for the cleaning treatment can be shortened. Besides, by shortening the time for the cleaning treatment, the device (more specifically, the ultrasonic cleaning section) can be shortened in length as compared with a conventional device. Incidentally, by heating not only the lower surface cleaning liquid 15 but also the upper surface cleaning liquid 13, the time for the cleaning treatment can be further reduced.

The upper surface cleaning liquid 13 used in cleaning of the upper surface of the glass substrate 11 is sucked by the upper cleaning-liquid-sucking nozzle 17 provided on the downstream side, to be removed to outside the ultrasonic cleaning device, for instance. The provision of the upper cleaning-liquid-sucking nozzle 17 enables (1) to prevent particles contained in the upper surface cleaning liquid 13 used for the cleaning treatment from again adhering to the glass substrate, and (2) to shorten the device (more specifically, the ultrasonic cleaning section) in length as compared with that in the conventional device.

The foregoing upper cleaning-liquid-sucking nozzle 17 is only required (1) to be positioned on the downstream side in the glass substrate 11 transport direction with respect to the upper cleaning-liquid-supply nozzle 12 and (2) to be positioned on the downstream side in the transport direction with respect to the lower cleaning-liquid-supply nozzle 14, but effects achieved by satisfying the foregoing requirements (1) and (2) are further enhanced by providing the upper cleaning-liquid-sucking nozzle 17 immediately on the downstream side to the lower cleaning-liquid-supply nozzle 14. Note that the cleaning-liquid-removing means may be a member like an air knife.

The foregoing cleaning liquid heating means is not particularly limited, and any thing is applicable as long as it heats the lower surface cleaning liquid 15 and/or the upper surface cleaning liquid 13.

Incidentally, in the present embodiment, the transport rollers 18 are used as the transport means for transporting the glass substrate 11, but the arrangement is not particularly limited to this.

Third Embodiment

Figure 5A:
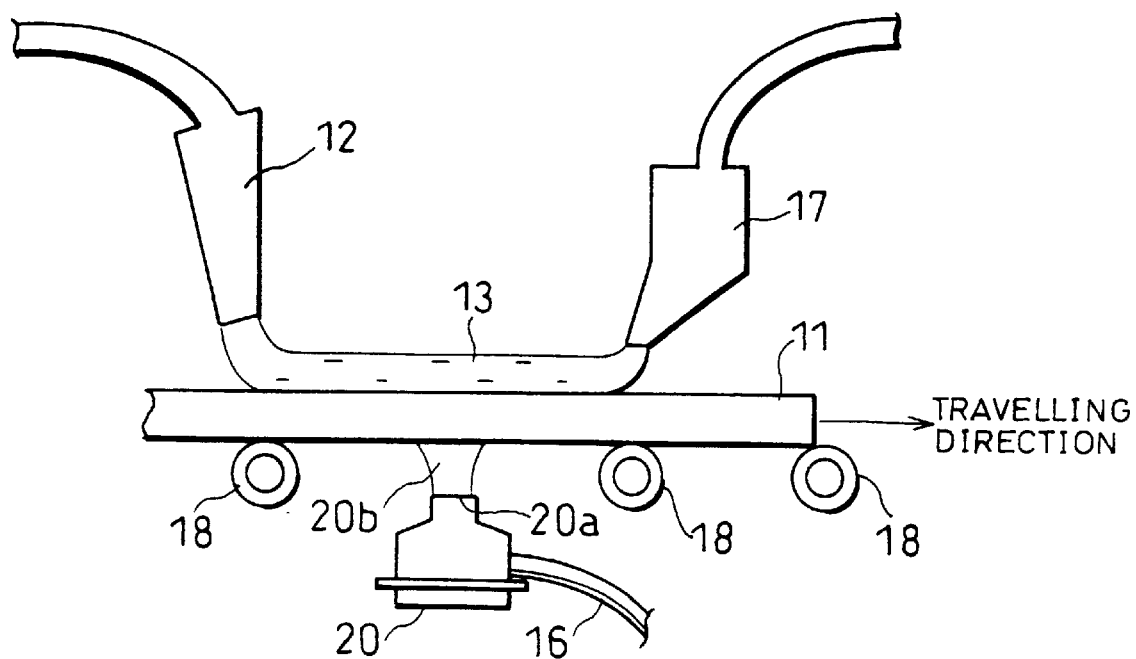
FIG. 5(a) is a side view schematically illustrating an arrangement of an ultrasonic cleaning section of an ultrasonic cleaning device in accordance with still another embodiment of the present invention.
Figure 5B:
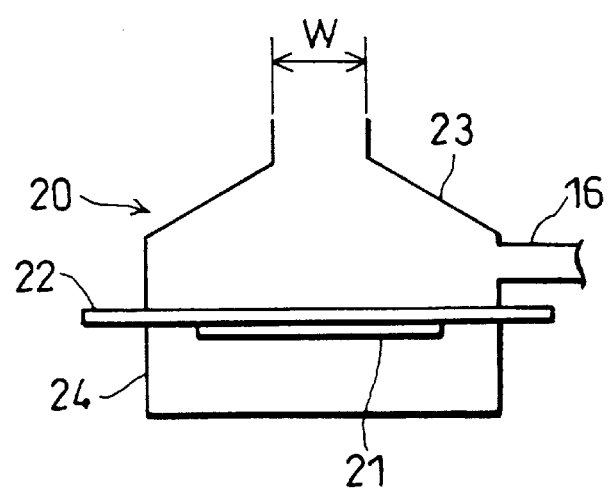
FIG. 5(b) is a cross-sectional view schematically illustrating an arrangement of an ultrasonic nozzle constituting cleaning-liquid-supply means.

The following description will explain still another embodiment of the present invention while referring to FIGS. 5(a) and 5(b). This however does not limit the present invention. Incidentally, the members having the same structure (function) as those in the second embodiment will be designated by the same reference numerals and their description will be omitted.

An ultrasonic cleaning device in accordance with the present embodiment is a cleaning device of the single substrate type according to the second embodiment except that an ultrasonic nozzle 20 is applied in the place of the lower cleaning-liquid-supply nozzle 14 of the foregoing second embodiment. The following description will focus on the ultrasonic nozzle 20 as the difference of the present embodiment from the second embodiment. Incidentally, FIG. 5(b) is a cross-sectional view of the ultrasonic nozzle 20 shown in FIG. 5(a), taken along a plane perpendicular to the upper surface (or the lower surface) of the glass substrate 11 and parallel with the glass substrate 11 travelling direction.

The ultrasonic nozzle 20 as cleaning-liquid-supply means includes: an ultrasonic oscillator 21; a vibrating plate 22; a nozzle-like housing 23; and a cover 24. The foregoing vibrating plate 22 is a rectangular-form thin plate provided between the nozzle-like housing 23 and the cover 24, and functions as a divider to divide (make non-continuous) a space inside the ultrasonic nozzle 20 into a space inside the nozzle-like housing 23 and a space inside the cover 24.

The ultrasonic oscillator 21 is made of a piezoelectric material such as lead zirconate-titanate, zirconium oxide, titanium oxide, lead oxide, or lithium niobate, so as to generate ultrasonic of a specific frequency in a range of 0.1 MHz to 10 MHz upon transmission of electricity. The ultrasonic oscillator 21 is firmly fixed to a center part of a surface of the vibrating plate 22 on the cover 24 side, so that the vibrating plate 22 vibrates according to the vibrating action of the ultrasonic oscillator 21. More specifically, in the present embodiment, the vibrating element for generating ultrasonic by the vibrating action is composed of the ultrasonic oscillator 21 and the vibrating plate 22. Note that in the ultrasonic nozzle 20, it is possible to replace the vibrating plate 22 with a plate-like structure made of a material inside which ultrasonic vibration is transmitted without attenuation.

In the cleaning treatment, the inside space of the nozzle-like housing 23 is filled with a lower surface cleaning liquid (cleaning liquid) 20b supplied through the cleaning-liquid-supply pipe 16 at all times, and the foregoing ultrasonic vibration is transmitted to the lower surface cleaning liquid 20b via the surface of the vibrating plate 22. The ultrasonic vibration transmitted to the lower surface cleaning liquid 20b exhibits strong directivity, thereby proceeding through the inside of the nozzle-like housing 23 in a direction perpendicular to the surface of the vibrating plate 22 (upwards).

Then, the lower surface cleaning liquid 20b to which the ultrasonic has been projected (to which the ultrasonic vibration is transmitted) is converged through a nozzle opening (cleaning-liquid-supply opening) 20a in a slit form provided at an end of the ultrasonic nozzle 20, thereby being supplied to the lower surface of the glass substrate 11. Incidentally, the present embodiment is identical to the first and second embodiments in the aspect that application of the ultrasonic cleaning treatment to both the upper and lower surfaces of the glass substrate is realized by applying the ultrasonic vibration from the lower surface side of the glass substrate 11, and therefore, detailed description on the same is omitted herein.

Further, the foregoing ultrasonic nozzle 20 is arranged so that a part of the lower surface cleaning liquid distribution path coming immediately on the downstream side to the vibrating element, that is, a part of the space inside the nozzle-like housing 23 in the vicinity of the vibrating plate 22, extends upwards from the upstream side to the downstream side. The effects achieved by this arrangement are identical to those in the first and second embodiments. The following description will explain the effects in more detail.

Bubbles are generated in the vicinity of an interface between the vibrating plate 22 and the lower surface cleaning liquid 20b due to the vibrating action of the vibrating element. The bubbles remain in the vicinity of the interface, thereby making an area of contact between the lower surface cleaning liquid 20b and the vibrating plate 22 smaller. This causes heat generated by the action of the vibrating element to be retained therein. Therefore, there is a possibility that the following problems arise: (1) a part of adhesion between the ultrasonic oscillator 21 and the vibrating plate 22 is heated, thereby resulting in that the adhesion is broken (the vibrating element is damaged or broken); and (2) the ultrasonic oscillator 21 is heated, thereby resulting in that oscillation characteristics become changed.

By positioning the vibrating element inside the ultrasonic nozzle 20 as described above, however, the bubbles generated are easily discharged to outside the ultrasonic nozzle 20, thereby allowing avoidance of such problems as the damage or the breaking of the vibrating element. Particularly, in the case where the vibrating element is composed of the vibrating plate 22 and the ultrasonic oscillator 21 fixed to only the vibrating plate 22, an effect can be achieved that a support member for supporting the ultrasonic oscillator 21 need not be additionally provided thereby simplifying the arrangement, whereas there remains a drawback in that the vibrating element tends to be damaged or broken, but the arrangement of the present invention solve the foregoing problem and provides particularly great advantages.

Incidentally, regarding the present invention, needless to say, "provision of a vibrating element in the cleaning liquid distribution path" may imply both the arrangement in which the a part of the vibrating element (vibrating plate 22) is positioned in the foregoing distribution path as in the present embodiment, and the arrangement in which the entirety of the vibrating element is positioned in the distribution path.

To surely prevent the glass substrate (work) 11 as the ultrasonic cleaning target from becoming damaged, the ultrasonic nozzle 20 is preferably disposed so that the nozzle opening 20a is located at a distance from the lower surface of the glass substrate 11 in a range of 0.1 mm to 50 mm so that the lower surface cleaning liquid 20b is supplied thereto. However, in the case where a gap width (slit width) W of the nozzle opening 20a is too great, a pressure of the lower surface cleaning liquid 20b supplied to the lower surface of the glass substrate 11 becomes small, thereby making it difficult to allow such a distance between the foregoing two. Consequently the possibility of damaging the glass substrate 11 increases. On the other hand, in the case where the gap width W of the nozzle opening 20a is too small, the ultrasonic vibration directly transmitted is hindered above the nozzle-like housing 23, thereby possibly reducing the cleaning power.

From the aforementioned viewpoints, the gap width W of the nozzle opening 20a is preferably not smaller than 1 mm and not greater than 30 mm. In the case where the ultrasonic oscillator 21 is in a 1 mm (height)×15 mm (width)×100 mm (length) rectangular parallelepiped shape and generates ultrasonic with a frequency of 1 MHz, the foregoing nozzle opening 20a is more preferably set to have a gap width of 5 mm and a length of 100 mm. Furthermore, in the case where the ultrasonic oscillator 21 is in a 2 mm (height)×40 mm (width)×100 mm (length) rectangular parallelepiped shape, and generates ultrasonic with a frequency of 0.5 MHz, the foregoing nozzle opening 20a is more preferably set to have a gap width of 25 mm and a length of 100 mm. Note that the "length" of the ultrasonic oscillator 21 corresponds to the "length" of the nozzle opening 20a.

By setting the gap width W of the nozzle opening 20a in the foregoing range, the time required for removing particles is drastically reduced without damaging the glass substrate 11, and the performance of the removal of particles is drastically improved.

As described above, an ultrasonic cleaning device in accordance with the present invention preferably includes transport means (transport rollers, etc.) capable of consecutively transporting a plurality of the cleaning targets (substrates, etc.) as targets of the ultrasonic cleaning treatment in a single direction, supporting the cleaning targets horizontally, the transport means being provided above the cleaning-liquid-supply means. With this arrangement, an effect can be achieved that the ultrasonic cleaning treatment can be applied consecutively to upper and lower surfaces of a plurality of cleaning targets.

The ultrasonic cleaning device in accordance with the present embodiment may be arranged so that the cleaning-liquid-supply means supplies the cleaning liquid to a lower surface of the cleaning target, the lower surface being opposite to an upper surface of the cleaning target to which an upper surface cleaning liquid is supplied.

According to the foregoing arrangement, the ultrasonic-applied cleaning liquid is supplied to the lower surface of the cleaning target in a state in which a layer of the upper surface cleaning liquid is formed on the upper surface of the cleaning target. The vibration transmitted to the lower surface of the cleaning target is further transmitted to the upper surface side without attenuation, thereby ensuring that not only particles adhering to the lower surface but also those adhering to the upper surface can be simultaneously removed by means of the cleaning liquid and the ultrasonic.

Furthermore, since the cleaning-liquid-supply opening of the cleaning-liquid-supply means is provided to face (diagonally) upwards, the following effect can be achieved. Namely, bubbles can be easily discharged through the cleaning-liquid-supply opening without an increase in the flow of the cleaning liquid, and moreover, intrusion of bubbles through the cleaning-liquid-supply opening can be easily prevented.

The ultrasonic cleaning device in accordance with the present invention is preferably arranged so that the ultrasonic has a frequency in a range of 0.1 MHz to 10 MHz. This ensures that the following effect can be achieved. Namely, there is no possibility of damaging the cleaning target, and fine particles adhering to the cleaning target can be removed at a higher rate.

The ultrasonic cleaning device in accordance with the present invention may be further arranged so that the ultrasonic cleaning section further includes cleaning-liquid-removing means for removing the upper surface cleaning liquid supplied to the upper surface of the cleaning target.

According to the foregoing arrangement, the upper surface cleaning liquid supplied to the upper surface of the cleaning target is removed by the cleaning-liquid-removing means. Therefore, the following effect can be achieved. Namely, the re-adhesion to the cleaning target of particles contained in the upper surface cleaning liquid used in the cleaning treatment can be prevented, and the device (more specifically, the ultrasonic cleaning section) can be made shorter in length as compared with a conventional device.

The ultrasonic cleaning device may be further arranged so that the ultrasonic cleaning section further includes cleaning liquid heating means.

According to the foregoing arrangement, the ultrasonic-applied cleaning liquid to be supplied (or having been supplied) to the cleaning target and/or the upper surface cleaning liquid are heated by the cleaning liquid heating means. Therefore, in the case where particles adhering to the cleaning target are organic substances or the like, the time required for the cleaning treatment can be shortened. Besides, by shortening the time for the cleaning treatment, the following effect can be achieved. Namely, the device (more specifically, the ultrasonic cleaning section) can be shortened in length as compared with a conventional device.

The ultrasonic cleaning device in accordance with the present invention may be arranged so that the cleaning-liquid-supply opening has a gap width of not less than 1 mm and not more than 30 mm.

With the foregoing arrangement, both the following effects can be achieved. Namely, a time required for the cleaning treatment can be shortened, and the cleaning performance can be improved.

Fourth Embodiment

Figure 6:
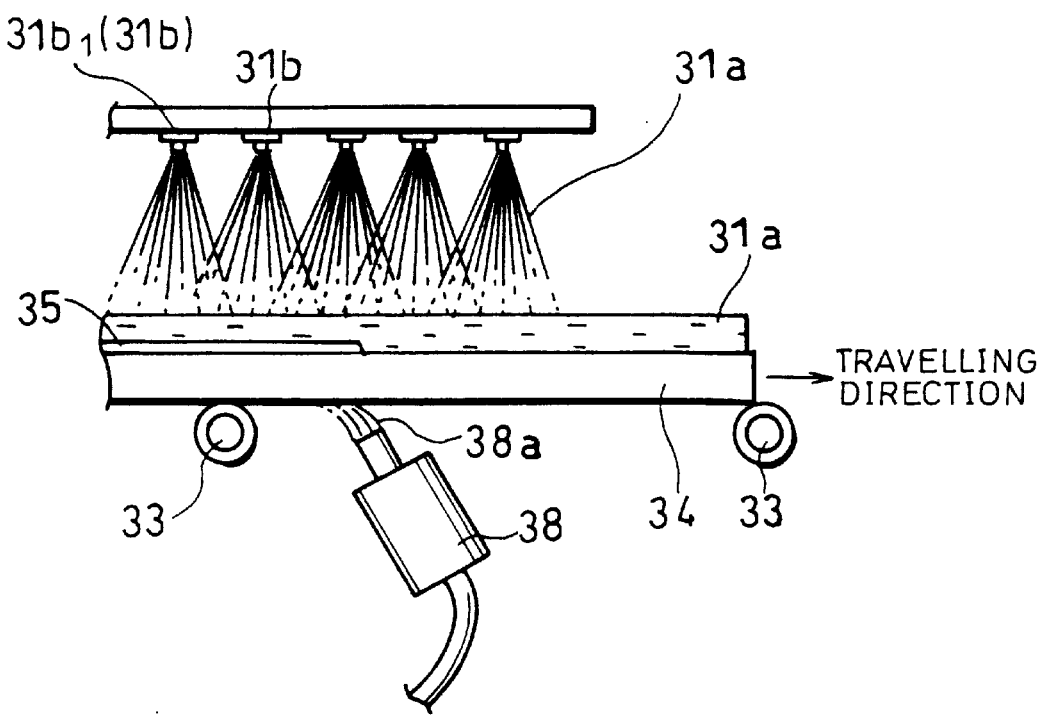
FIG. 6 is a side view schematically illustrating an arrangement of a stripping section of a resist-stripping device in accordance with still another embodiment of the present invention.

The following description will explain still another embodiment of the present invention while referring to FIG. 6. This however does not limit the present invention.

A resist-stripping device in accordance with the present embodiment is a stripping device of a single substrate type, and is used in, for instance, a liquid crystal display element fabrication process. A stripping section thereof includes, as shown in FIG. 6, stripper-supply shower nozzles (stripper-supply means) 31b disposed above a glass substrate 34 as a target of resist stripping (in a direction in a range of the diagonally upward direction to the upward direction from the glass substrate 34), an ultrasonic nozzle (liquid-supply means) 38 disposed below the glass substrate 34, and transport rollers 33 for transporting the glass substrate 34 in a travelling direction. Incidentally, "above the glass substrate 11" and "below the glass substrate 11" define the same as "above the transport means for transporting the glass substrate 11" and "below the transport means for transporting the glass substrate 11", respectively.

The stripper-supply shower nozzles 31b are disposed at uniform spaces along the glass substrate 34 travelling direction (transport direction), to supply the resist stripper 31a to a resist-applied surface of the glass substrate 34. The ultrasonic nozzle 38 is provided on the downstream side in the travelling direction with respect to the stripper-supply shower nozzle $31b_1$ on the most upstream side in the travelling direction, so as to supply an ultrasonic-applied liquid 38a to a surface (back surface) opposite to the resist-applied surface to which the resist stripper 31a has been supplied. Note that the number of the stripper-supply shower nozzles 31b and the number of the ultrasonic nozzles 38 are not particularly limited.

Further, a loader section is provided, though not shown, on the upstream side to the stripping section (on the upstream side in the glass substrate 34 travelling direction). The loader section takes up the glass substrates 34 one by one consecutively from a transport-use cassette capable of storing a plurality of the glass substrates 11 (for example, 20 pieces), and sends the same in a horizontal state out to the cleaning section at constant intervals. The rate of transport of the glass substrates 11 (only one piece is shown) is 600 mm/min., which is common in all the units in the ultrasonic cleaning device. Furthermore, though not shown, there are provided a rinsing section, a water-washing section, a drying section, and an unloader section on the downstream side to the stripping section in the stated order from the upstream side.

The glass substrate 34 sent out of the loader section is horizontally transported by the transport rollers 33 in a state in which a surface (back surface) opposite to a resist-applied surface of the glass substrate 34 is in contact with the transport rollers 33, thereby becoming brought into the stripping section. The stripper-supply shower nozzles 31b provided in the stripping section continuously supply the resist stripper 31a while, for instance, the glass substrate 34 is being transported in the stripping section. Consequently, a layer of the resist stripper 31a is formed over an entirety of the resist-applied surface. The type of the resist stripper 31a is not particularly limited, and it may be appropriately selected depending on the type of a photoresist (resist) 35. In the present embodiment, ELM-R10 (trade name, available from Mitsubishi Chemical Gas Co., Inc.) is used.

Incidentally, the method of supplying the resist stripper 31a to the resist-applied surface is not particularly limited, and concrete examples of the same include a dropping method, a spraying method, and a jetting method.

On the other hand, ultrasonic shower (liquid 38a) is projected linearly to the surface (back surface) opposite to the resist-applied surface with the layer of the resist stripper 31a. The direction of projection of the ultrasonic shower is not particularly limited, and for instance, it may be projected in a direction substantially perpendicular to the back surface (a direction orthogonal to the travelling direction of the glass substrate 34).

Upon projection of the ultrasonic shower to the back surface opposite to the resist-applied surface, the ultrasonic vibration is transmitted to the layer of the resist stripper 31a on the resist processed surface through the inside of the glass substrate 34. Consequently, reaction between the resist stripper 31a and the photoresist 35 is promoted. More specifically, the stripping of the photoresist 35 from the resist-applied surface and the dissolution of the photoresist 35 into the stripper 31a is promoted, resulting in drastic reduction of the time required to strip the resist stripping treatment as compared with the time in the conventional cases. Therefore, it is possible to shorten the resist-stripping device (more specifically the stripping section) in length, and to make the footprint smaller. Furthermore, the usage of the resist stripper 31a can be decreased, and hence it is possible to make a space for storing the stripper 31a smaller, and to reduce the possibility of danger stemming from storage of the stripper 31a.

An arrangement in which ultrasonic vibration is directly applied to the resist-applied side, which is different from that of the present invention, is expected to provide improvement of the rate of resist stripping treatment. The arrangement of the present invention, however, further enables to achieve an effect of making it possible to strip only the photoresist 35 without damaging the structure (circuit patterns, etc.) formed on the resist-applied surface, since the ultrasonic vibration is indirectly transmitted to the resist-applied side.

Incidentally, if the resist stripper 31a supplied to the resist-applied surface is heated beforehand, the following effect can be achieved: the time required for the resist stripping treatment can be further shortened, and the usage of the resist stripper 31a is further reduced.

The frequency of ultrasonic projected to the liquid 38a is not particularly limited, and is preferably in a range of 0.1 MHz to 5 MHz, more preferably in a range of 0.3 MHz to 3 MHz, and further more preferably in a range of 0.5 MHz to 1.5 MHz. In the case where the frequency is in the foregoing range, the time required for the resist stripping treatment can be drastically decreased without damaging the resist-applied matter (glass substrate 34).

Furthermore, the composition of the liquid 38a is not particularly limited, but it is preferably the resist stripper 31a. This enables to remove the photoresist adhering to edges of the resist-applied matter, and also to remove organic substances adhering to and hence soiling the back surface upon hot-plate treatment (heating treatment) in the photolithography step.

Since normally the quantity of the photoresist adhering to the back surface of the resist-applied surface is small, the life time of the liquid 38a is more than 10 times that of the resist stripper 31a normally used (i.e., the part supplied to the resist-applied surface), and it is easily recycled and re-used. Note that pure water, for instance, may be used in the case where the organic soils such as photoresist, for instance, are not present on the back surface opposite to the resist-applied surface.

The glass substrate 34 is transported to the rinsing section. The rinsing section replaces the resist stripper 31a remaining on the glass substrate 34 with a rinsing liquid made of DMSO (dimethyl sulfoxide) liquid, so as to prevent the resist stripper 31a and the photoresist from being brought into the water-washing section provided in the downstream side. More specifically, the provision of the rinsing section is intended to avoid the following problems caused by the resist stripper 31a and the photoresist brought into the water-washing section: (1) pure water stored in the water-washing section is caused to have alkalinity, thereby causing erosion of wires on the glass substrate 34; (2) loading on the sewerage increase. Incidentally, in the present embodiment, the resist stripper 31a is continuously supplied to the stripper-supply shower nozzles 31b. Consequently, most of the photoresist 35 stripped and dissolved is washed off from the resist-applied surface by the time when the glass substrate 34 is transported to the rinsing section.

In the water-washing section on the downstream side to the rinsing section, the rinsing liquid is removed by shower washing from above and below the glass substrate 34. Subsequently, fine particles such as organic substances adhering to the glass substrate are removed by megaosnic shower.

The glass substrate 34 washed in the water-washing section is drained and dried by an air knife provided in the driving section, and is then housed in the cassette by the unloader section, whereby the resist stripping operation is completed. In the fabrication process of TFT (thin film transistor) substrates, this resist stripping operation is repeated five to seven times.

Incidentally, the glass substrate 34 transport means is not particularly limited to the transport rollers 33. In the case where the stripper-supply shower nozzles 31b are provided over an entirety of the resist-applied surface of the glass substrate 34, the glass substrate 34 may be stopped when the resist stripper 31a is being supplied.

Fifth Embodiment

Figure 7:
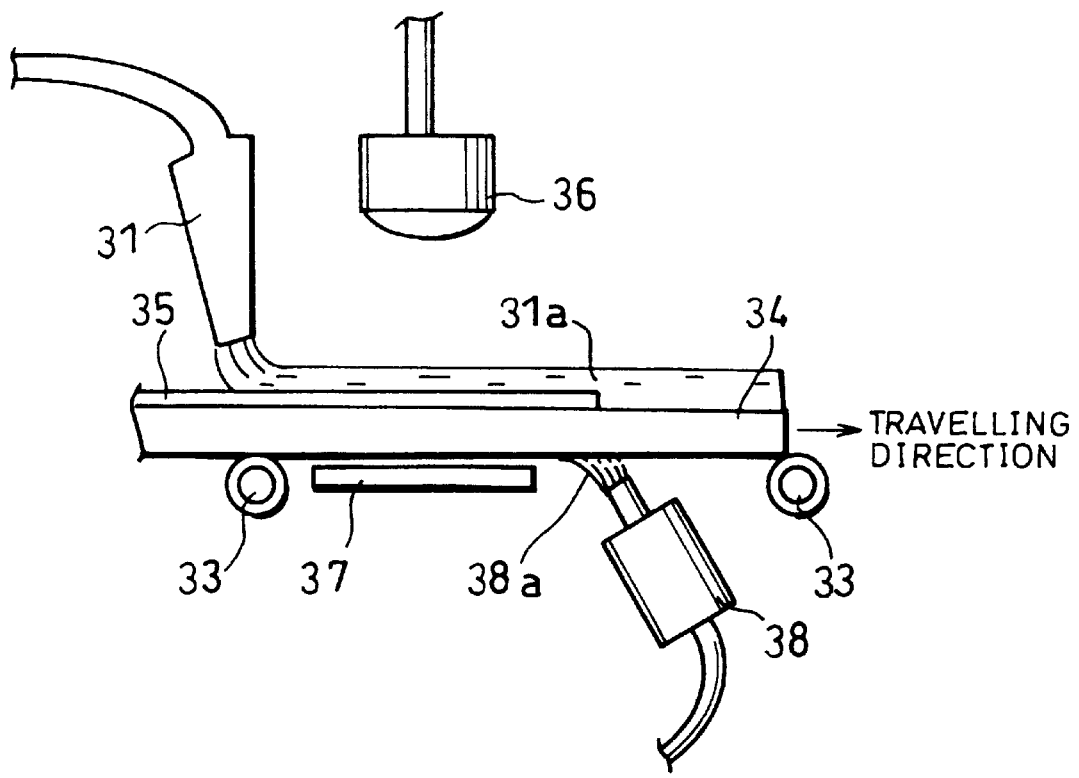
FIG. 7 is a side view schematically illustrating an arrangement of a stripping section of a resist-stripping device in accordance with still another embodiment of the present invention.

The following description will explain still another embodiment of the present invention, while referring to FIG. 7. This however does not limit the present invention. Incidentally, the members having the same structure (function) as those in the fourth embodiment will be designated by the same reference numerals and their description will be omitted.

Differences of a resist-stripping device in accordance with the present embodiment from that in accordance with the fourth embodiment are the following points as shown in FIG. 7: (1) the stripper-supply shower nozzles 31b as stripper-supply means are replaced with a stripper-supply nozzle 31; (2) a heater (heating means) 36 for heating the resist stripper 31a (and the glass substrate 34 as a resist-applied matter); and (3) a hot plate (heating means) 37.

The position of the stripper-supply nozzle 31 is nor particularly limited as long as it is above the transport rollers 33. It is, however, preferably provided in the vicinity of the stripping section so that the timing of start of the resist stripping treatment can be advanced and the stripping section can be shortened in length. Furthermore, the ultrasonic nozzle 38 is provided on the downstream side in the glass substrate 34 travelling direction with respect to the stripper-supply nozzle. Incidentally, the number of the stripper-supply nozzle 31 and the number of the ultrasonic nozzles 38 are not particularly limited.

The glass substrate 34 sent out of the loader section located on the upstream side to the stripping section is horizontally transported by the transport rollers 33 in a state in which a surface (back surface) opposite to a resist-applied surface of the glass substrate 34 is in contact with the transport rollers 33, with the resist-applied surface facing upwards. The supply of the resist stripper 31a to the resist-applied surface is started at a timing at which a front end of the glass substrate 34 comes to a position of a nozzle opening of the stripper-supply nozzle 31 provided in the vicinity of the stripping section, and it is stopped at a timing at which a rear end of the glass substrate 34 comes to a position of the foregoing nozzle opening. In other words, the resist stripper 41a is supplied to each resist-applied surface (exclusively), or more concretely, so that the resist stripper 31a does not fall from edges of the glass substrate 34.

The foregoing resist stripper 31a may be appropriately selected depending on the type of the photoresist (resist) 35 and the like. In the present embodiment, a mixture of DMSO (dimethyl sulfoxide) and NMP (N-methyl pyrrolidone) is used. The resist stripper 31a is laminated to a thickness of about 1 mm on the resist-applied surface, and such a quantity is sufficient for dissolution of the photoresist 35 that is laminated to a thickness of 1 $\mu$m to 2 $\mu$m normally.

The shape of the nozzle opening of the stripper-supply nozzle 31 is not particularly limited, but in the present embodiment, it is in a slit form, having a width substantially equal to the width of the glass substrate 34. Therefore, it is possible to supply the resist stripper 31a to a uniform thickness on an entirety of the resist-applied surface. Incidentally, the method for supplying the resist stripper 31a onto the-resist-applied surface to a uniform thickness is not particularly limited to the above-described method. More specifically, the following method, for example, can be applied: the transport rollers 33 in the vicinity of the stripper-supply nozzle 31 are obliquely arrayed so that those on the downstream side are disposed at lower positions, so that the resist stripper 31a supplied to the vicinity of the rear end of the glass substrate 34 is spread uniformly by means of the slant.

In the resist-stripping device in accordance with the present embodiment, the glass substrate 34 is transported at a predetermined speed therein. Therefore, the timing of supply of the resist stripper 31a can be easily found by preliminarily calculating the timing at which a predetermined position of the glass substrate 34 (for instance, a front end or a rear end) arrives at a position corresponding to the stripper-supply nozzle 31.

Depending on situations, however, the timings of start/stop of supply of the resist stripper 31a by the stripper-supply nozzle 31 may be adjusted by means of timing adjusting means such as a substrate front end position detecting sensor or the like additionally provided.

The provision of the foregoing timing adjusting means enables to prevent a shift of the timing of supply of the resist stripper 31a due to failures in the transport of the glass substrate 34. Besides, since the timings of start/stop of supply of the resist stripper 31a can be precisely adjusted, a more uniform and clean finished state of the resist stripping treatment can be achieved, while the usage of the resist stripper 31a is further reduced.

By supplying the resist stripper 31a to each resist-applied surface of the glass substrate 34 in the aforementioned manner, the usage of the resist stripper 31a can be remarkably reduced. More specifically, the usage of a stripper can be remarkably reduced, as compared with the quantity of the stripper (in the case where the resist stripper is not recycled and re-used) required per a unit area (one piece of a substrate with resist applied, for instance) in the case of the conventional device of the single substrate shower type. Moreover, the usage of a stripper can be reduced to about ½ the quantity of the stripper (in the case where the resist stripper is not recycled and re-used) required per a unit area in the case of the conventional device of the single substrate dipping type.

Furthermore, since fresh resist stripper 31a is supplied to the resist-applied surface to a uniform thickness at all times (in the case where the resist stripper 31a is not recycled or re-used), a more uniform and clean finished state of the resist stripping treatment can be obtained, while improvement of the quality of products and increase in the yield of products can be achieved. Incidentally, like in the fourth embodiment, the resist stripper 31a can be recycled and re-used depending on conditions.

While the glass substrate 34 is being transported to the downstream side after the supply of the resist stripper 31a is started, the photoresist 35 on the resist-applied surface dissolves in the resist stripper 31a. The dissolution of the photoresist 35 into the resist stripper 31a is promoted by the ultrasonic vibration transmitted to the layer of the resist stripper 31a on the resist-applied surface via the inside of the glass substrate 34, like in the fourth embodiment.

Here, as the resist stripper 31a on the resist-applied matter is heated by the foregoing heater 36 and the hot plate 37, dissolution of the resist into the stripper 31a is promoted, thereby resulting in that the time for stripping the resist can be reduced. Accordingly, the resist-stripping device (more specifically, the stripping section) can be further shortened in length, while the footprint can be made further smaller.

The foregoing heating means is not particularly limited as long as it is capable of heating the resist stripper 31a on the resist-applied surface and/or the resist stripper 31a before being supplied onto the resist-applied surface. More concretely, it may be any thing provided that it is capable of heating at least one of the resist stripper 31a, the glass substrate 34, and atmosphere inside the stripping section. In other words, the resist stripper 31a heating method taken by the heating means may be a direct heating method, or may be an indirect heating method.

Furthermore, needless to say, an effect of promotion of the dissolution of the photoresist 35 can be still achieved in the case where only the heater 36 or the hot plate 37 is provided.

The glass substrate 34 is subsequently transported to the rinsing section, where it is washed and dried, like in the fourth embodiment.

Incidentally, the glass substrate 34 transport means is not particularly limited to the transport rollers 33. Alternatively, depending on conditions, the stripper-supply nozzle 31 may be moved from the downstream side to the upstream side. Further, alternatively, the glass substrate 34 and the stripper-supply nozzle 31 may be moved in respective directions opposite to each other. In other words, the glass substrate 34 and the stripper-supply nozzle 31 may be moved relatively.

Sixth Embodiment

Figure 8:
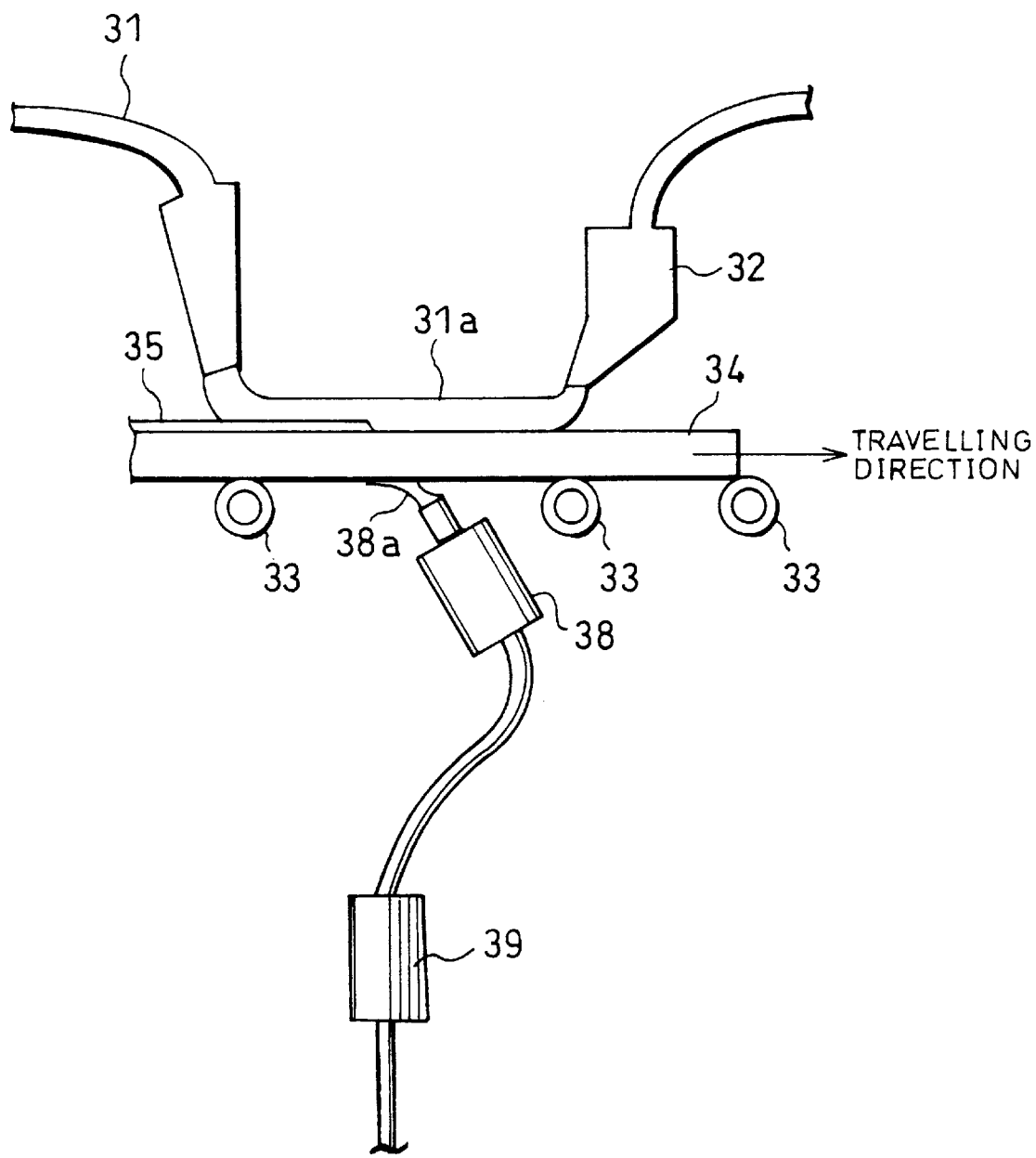
FIG. 8 is a side view schematically illustrating an arrangement of a stripping section of a resist-stripping device in accordance with still another embodiment of the present invention.

The following description will explain still another embodiment of the present invention, while referring to FIG. 8. This however does not limit the present invention. Incidentally, the members having the same structure (function) as those in the fourth and fifth embodiments will be designated by the same reference numerals and their description will be omitted.

A resist-stripping device in accordance with the present embodiment is a single-substrate-type stripping device that is used in, for example, a liquid crystal display element fabrication process. As shown in FIG. 8, a stripping section thereof includes a stripper sucking nozzle (stripper-removing means) 32 above transport rollers 33 for transporting a resist-applied matter (glass substrate 34), and a stripper-supply nozzle (stripper-supply means) 31 provided on the upstream side in the glass substrate 34 travelling (transport) direction (hereinafter referred to simply as upstream side, depending on situations) with respect to the stripper sucking nozzle 32. Additionally, the stripping section further includes an ultrasonic nozzle (liquid-supply means) 38 below the transport rollers 33, and a heater (liquid heating means) 39 for heating liquid that is provided on the downstream side to the ultrasonic nozzle 38. The stripper-supply nozzle 31, the ultrasonic nozzle 38, and the stripper sucking nozzle 32 are arranged in the stated order from the upstream side to the downstream side in the glass substrate 34 transport direction.

The stripper-supply nozzle 31 functions to supply the resist stripper 31a to the resist-applied surface of the glass substrate 34, and the stripper sucking nozzle 32 functions to suck and remove the resist stripper 31a in which photoresist (resist) 35 dissolves. Incidentally, the number of the stripper-supply nozzle 31 and the stripper sucking nozzle 32 provided in one stripping section is not particularly limited. Besides, the heater 39 functions to heat the liquid 38a before the liquid 38a is supplied to a surface (back surface) opposite to the resist-applied surface of the glass substrate 34.

The glass substrate 34 sent out of the loader section located on the upstream side to the stripping section is horizontally transported by the transport rollers 33 in a state in which the back surface opposite to the resist-applied surface of the glass substrate 34 is in contact with the transport rollers 33, with the resist-applied surface facing upwards. The start and stop of supply of the resist stripper 31a are carried out in the same manner as that in the fifth embodiment.

While the glass substrate 34 is being transported to the downstream side after the supply of the resist stripper 31a is started, the photoresist 35 on the resist-applied surface dissolves in the resist stripper 31a. The dissolution of the photoresist 35 into the resist stripper 31a is promoted by the ultrasonic vibration transmitted to the layer of the resist stripper 31a on the resist-applied surface via the inside of the glass substrate 34, like in the fourth embodiment.

The provision of the heater 39 enables to supply the ultrasonic-applied liquid 38a, after heating the same, onto the back surface opposite to the resist-applied surface. The heat possessed by the liquid 38a is indirectly transmitted to the resist stripper 31a on the resist-applied surface, thereby raising the temperature of the resist stripper 31a. Consequently, the dissolution of the photoresist 35 into the resist stripper 31a is promoted, thereby resulting in that the time for stripping the resist can be reduced.

Subsequently, the photoresist 35-dissolving resist stripper 31a is sucked by the stripper sucking nozzle 32 disposed on the downstream side to the stripper-supply nozzle 31 at a predetermined distance therefrom, so as to be discharged to outside the resist-stripping device.

Incidentally, the distance between the stripper-supply nozzle 31 and the stripper sucking nozzle 32 is not particularly limited, and it may be appropriately set depending on the glass substrate 34 transport speed, and the rate of dissolution of the photoresist 35 into the resist stripper 31a. By appropriately setting of the distance, the resist stripper 31a can be immediately removed after the stripping of the photoresist 35 is completed. Consequently, the stripping section can be shortened in length.

Alternatively, depending on situations, the stripper sucking nozzle 12 may be replaced with, as stripper-removing means, an air knife and a stripping device capable of collecting the resist stripper removed by the air knife and discharging the same to outside the resist-stripping device.

In the foregoing resist-stripping device in accordance with the present embodiment, the resist stripper 31a supplied to the glass substrate 34 is discharged to outside the resist-stripping device. Therefore, a large-scale circulation-use tank for storing and circulating the stripper 31a becomes unnecessary, and a total amount of dangerous matters (organic solvent as the resist stripper and the like) in the resist-stripping device can be decreased.

Furthermore, in the case where the resist stripper 31a is supplied to the glass substrate 34 from the front head side thereof, an interval between the supply of the resist stripper 31a and the sucking and removal of the same (i.e., the time required for dissolution of the photoresist 35) is uniform irrespective of positions on the resist-applied surface, as the glass substrate 34 is transported at a predetermined transport speed. Additionally, since fresh resist stripper 31a is supplied to the resist-applied surface to a uniform thickness, a more uniform and clean finished state of the resist stripping treatment can be obtained, while improvement of the quality of products and increase in the yield of products can be achieved.

More specifically, the resist-stripping device in accordance with the present embodiment is arranged so that fresh resist stripper 31a is always used, unlike in the conventional batch-type, single-substrate type resist-stripping devices in which the resist stripper is replaced with fresh one every time a predetermined number of pieces of substrates have been processed or every time a predetermined period of time has passed. Therefore, a problem that substrates processed before and after replacement of the resist stripper differ in cleanness does not occur.

Incidentally, timings of supply and removal of the resist stripper 31a may be controlled by means of timing adjusting means such as a substrate front end position detecting sensor or the like additionally provided, as described in conjunction with the foregoing fifth embodiment.

The glass substrate 34 is then transported to the rinsing section, so as to be washed and dried in the same manner as that in the foregoing fourth embodiment.

Seventh Embodiment

Figure 9A:
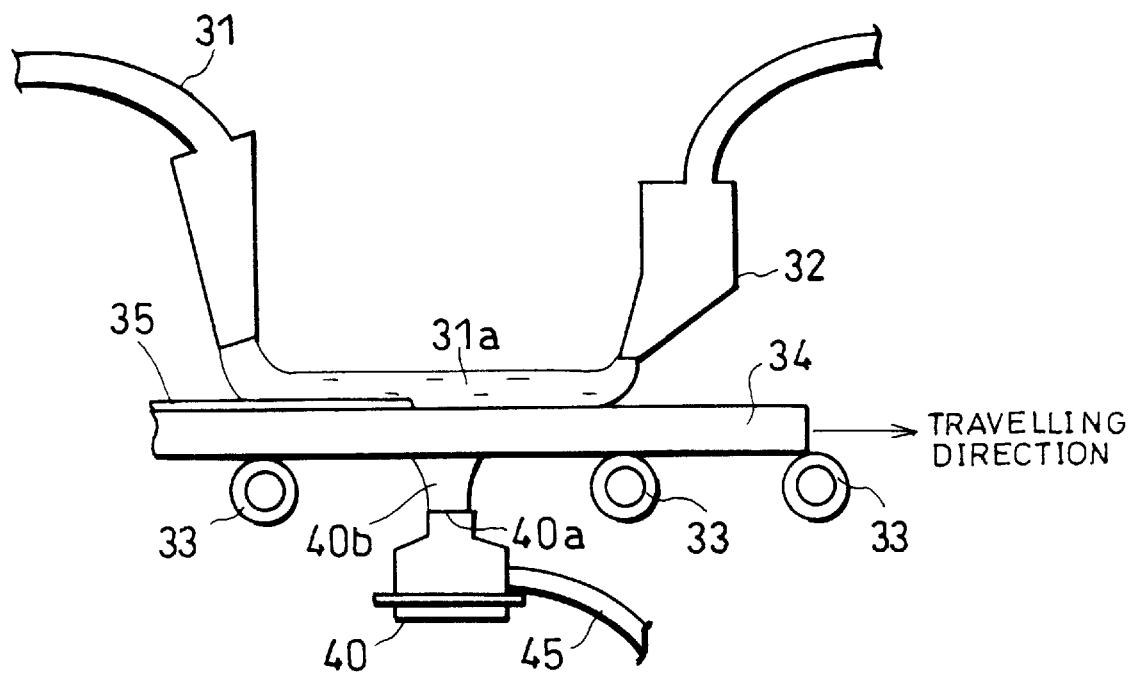
FIG. 9(a) is a side view schematically illustrating an arrangement of an stripping section of a resist-stripping device in accordance with still another embodiment of the present invention.
Figure 9B:
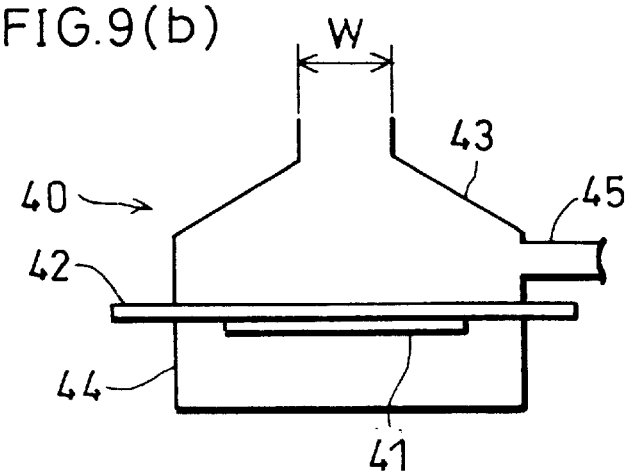
FIG. 9(b) is a cross-sectional view schematically illustrating an arrangement of an ultrasonic nozzle constituting liquid-supply means.

The following description will explain still another embodiment of the present invention, while referring to FIGS. 9(a) and 9(b). This however does not limit the present invention. Incidentally, the members having the same structure (function) as those in the sixth embodiment will be designated by the same reference numerals and their description will be omitted.

A resist-stripping device in accordance with the present embodiment is a single-substrate-type stripping device, and a stripping section thereof includes an ultrasonic nozzle 40 in the place of the ultrasonic nozzle 38 in the sixth embodiment. The following description will focus on the ultrasonic nozzle 40 as the difference of the present embodiment from the sixth embodiment. Incidentally, FIG. 9(b) is a cross-sectional view of the ultrasonic nozzle 40 shown in FIG. 9 (a), taken along a plane perpendicular to the upper surface (or the lower surface) of the glass substrate 34 and parallel with the glass substrate 34 travelling direction.

The ultrasonic nozzle 40 as liquid-supply means includes: an ultrasonic oscillator 41; a vibrating plate 42; a nozzle-like housing 43; and a cover 44. The foregoing vibrating plate 42 is a rectangular-form thin plate provided between the nozzle-like housing 43 and the cover 44, and functions as a divider to divide (make non-continuous) a space inside the ultrasonic nozzle 40 into a space inside the nozzle-like housing 43 and a space inside the cover 44.

The ultrasonic oscillator 41 is made of a piezoelectric material such as lead zirconate-titanate, zirconium oxide, titanium oxide, lead oxide, or lithium niobate, so as to generate ultrasonic of a specific frequency in a range of 0.1 MHz to 5 MHz upon transmission of electricity. The ultrasonic oscillator 41 is firmly fixed in a center part of a surface of the vibrating plate 42 on the cover 44 side, so that the vibrating plate 42 vibrates according to the vibrating action of the ultrasonic oscillator 41. More specifically, in the present embodiment, the vibrating element for generating ultrasonic by the vibrating action is composed of the ultrasonic oscillator 41 and the vibrating plate 42. Note that in the ultrasonic nozzle 40, it is possible to replace the vibrating plate 42 with a plate-like structure made of a material inside which ultrasonic vibration is transmitted without attenuation.

In the resist stripping treatment, the inside space of the nozzle-like housing 43 is filled with resist stripper (liquid) 40b supplied through a cleaning-liquid-supply pipe 45 at all times, and the foregoing ultrasonic vibration is transmitted to the resist stripper 40b via the surface of the vibrating plate 42. The ultrasonic vibration transmitted to the resist stripper 40*b* exhibits strong directivity, thereby proceeding through the inside of the nozzle-like housing 43 in a direction perpendicular to the surface of the vibrating plate 42 (upwards).

Then, the resist stripper 40*b* to which the ultrasonic has been projected (to which the ultrasonic vibration is transmitted) is converged through a nozzle opening (opening) 40*a* in a slit form provided at an end of the ultrasonic nozzle 40, thereby being supplied to the back surface opposite to the resist-applied surface of the glass substrate 34. Incidentally, the present embodiment is identical to the fourth embodiment in the aspect that application of the dissolution of the photoresist 35 in the resist stripper 31*a* is promoted by the ultrasonic vibration transmitted from the back surface through the inside of the glass substrate 34 to the layer of the resist stripper 31*a* on the resist-applied surface, and therefore, detailed description on the same is omitted herein.

To surely prevent the glass substrate (work) 34 as the stripping treatment target from becoming damaged, the ultrasonic nozzle 40 is preferably disposed so that the nozzle opening 40*a* is located at a distance from the lower surface of the glass substrate 34 in a range of 0.1 mm to 50 mm so that the resist stripper 40*b* is supplied thereto. However, in the case where a gap width (slit width) W of the nozzle opening 40*a* is too great, a pressure of the lower surface cleaning liquid 40*b* supplied to the lower surface of the glass substrate 34 is small, thereby making it difficult to allow such a distance between the foregoing two. Consequently the possibility of damaging the glass substrate 34 increases. On the other hand, in the case where the gap width W of the nozzle opening 40*a* is too small, the ultrasonic vibration directly transmitted is hindered above the nozzle-like housing 43, thereby possibly reducing the power for stripping the photoresist 35.

From the aforementioned viewpoints, the gap width W of the nozzle opening 40*a* is preferably not smaller than 1 mm and not greater than 30 mm. In the case where the ultrasonic oscillator 41 is in a 1 mm (height)×15 mm (width)×100 mm (length) rectangular parallelepiped shape and generates ultrasonic with a frequency of 1 MHz, the foregoing nozzle opening 40*a* is more preferably set to have a gap width of 5 mm and a length of 100 mm. Furthermore, in the case where the ultrasonic oscillator 41 is in a 2 mm (height)×40 mm (width)×100 mm (length) rectangular parallelepiped shape, and generates ultrasonic with a frequency of 0.5 MHz, the foregoing nozzle opening 40*a* is more preferably set to have a gap width of 25 mm and a length of 100 mm. Note that the "length" of the ultrasonic oscillator 41 corresponds to the "length" of the nozzle opening 40*a*.

By setting the gap width W of the nozzle opening 40*a*, the time required for removing particles is drastically reduced without damaging the glass substrate (resist-applied matter) 34.

As described above, a resist-stripping device in accordance with the present invention preferably includes transport means (transport rollers, etc.) capable of consecutively transporting a plurality of the resist-applied matters (substrates, etc.) as targets of the ultrasonic cleaning treatment, supporting the resist-applied matters horizontally with resist-applied surfaces facing upwards, and is arranged so that the stripper-supply means is provided above the transport means, while the liquid-supply means is provided below the transport means.

The resist-stripping device in accordance with the present invention is preferably arranged so that the ultrasonic has a frequency in a range of 0.1 MHz to 5 MHz. This ensures that the following effects can be achieved. Namely, without possibility of damaging the resist-applied matter, the time required for the resist stripping treatment can be drastically shortened, and the usage of the resist stripper is further reduced.

The resist-stripping device in accordance with the present invention may be further arranged so that the stripping section further includes liquid heating means for heating the liquid.

The foregoing arrangement ensures that the ultrasonic-applied (projected) liquid is, after being heated by the liquid heating means, supplied onto the back surface opposite to the resist-applied surface. The heat possessed by the ultrasonic-applied liquid is indirectly transmitted to the resist stripper on the resist-applied surface, thereby raising the temperature of the resist stripper. Consequently, the dissolution of the resist into the resist stripper is promoted, thereby resulting in that the time for stripping the resist can be reduced, and that the usage of the resist stripper can be decreased.

The resist-stripping device in accordance with the present invention is preferably arranged so that the liquid is the resist stripper. This arrangement ensures that the following effect can be achieved. Namely, the resist adhering to the back surface opposite to the resist-applied surface, the resist adhering to edges, and organic substances adhering to and soiling the back surface upon a hot plate treatment can be removed.

The resist-stripping device in accordance with the present invention may be arranged so that the resist stripper is supplied exclusively to each resist-applied surface by the stripper-supply means. According to the foregoing arrangement, the resist stripper is supplied to each resist-applied surface by the stripper-supply means. In other words, the quantity of the resist stripper used in the resist-stripping treatment is only the quantity of the resist stripper dropped (supplied) onto each resist-applied surface, and it is hence possible to remarkably reduce the usage of the same as compared with the quantity of the stripper required per a unit area in the case of the conventional device of the single substrate shower type. The usage of the same is also remarkably reduced as compared with the quantity of the stripper required per a unit area in the case of the conventional device of the single substrate dipping type. In other words, an effect can be achieved that a low-material-consuming resist-stripping device of a single substrate type can be provided.

The resist-stripping device in accordance with the present invention may be arranged so that the stripping section further includes heating means for heating the resist-applied matter and/or the resist stripper.

According to the foregoing arrangement, with a rise of the temperature of the resist-stripping liquid, the stripping (dissolution) of the resist into the stripper is promoted, thereby resulting in that the time for stripping the resist can be reduced. Besides, the usage of the resist stripper can be decreased. Accordingly, the following effects can be achieved. Namely, the resist-stripping device can be shortened in length, the footprint can be made smaller, and the usage of the resist stripper can be decreased.

The resist-stripping device in accordance with the present invention may be further arranged so that the stripping section further includes stripper-removing means for removing the resist stripper containing the resist stripped.

According to the foregoing arrangement, the resist stripper can be removed immediately after the resist is stripped.

Therefore, an effect of shortening the stripping section in length can be achieved.

The resist stripping device in accordance with the present invention may be arranged so that the liquid-supply means has an opening for therethrough supplying the ultrasonic-applied liquid to the back surface, and that the opening has a gap width of not less than 1 mm and not more than 30 mm.

The foregoing arrangement enables to shorten the time required for the resist-stripping treatment, without damaging the resist-applied matter.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An ultrasonic cleaning device, comprising:

an ultrasonic cleaning section including cleaning-liquid-supply means for supplying an ultrasonic-applied cleaning liquid to a cleaning target through a cleaning-liquid-supply opening, wherein:

said ultrasonic cleaning section includes a vibrating element for generating ultrasonic vibrations in a cleaning liquid distribution path, at a position on an upstream side to said cleaning-liquid-supply opening, wherein said cleaning-liquid-supply opening is a nozzle opening in a slit form; and a part of the cleaning liquid distribution path immediately on a downstream side to said vibrating element extends from an upstream side to a downstream side in a direction in a range of a horizontal direction to an upward direction, wherein said cleaning-liquid-supply means supplies the cleaning liquid to a lower surface of the cleaning target, the lower surface being opposite to an upper surface of the cleaning target to which an upper surface cleaning liquid is supplied and the ultrasonic vibrations have a frequency in a range of 0.1 MHz to 10 MHz.

2. The ultrasonic cleaning device as set forth in claim 1, further comprising:

cleaning-liquid-removing means for removing the upper surface cleaning liquid supplied to the upper surface of the cleaning target.

3. The ultrasonic cleaning device as set forth in claim 1, further comprising cleaning liquid heating means.

4. The ultrasonic cleaning device as set forth in claim 1, wherein said cleaning-liquid-supply opening has a gap width of not less than 1 mm and not more than 30 mm.

5. The ultrasonic cleaning device as set forth in claim 1, wherein:

said vibrating element includes an ultrasonic oscillator and a vibrating plate; and said ultrasonic oscillator is fixed to only said vibrating plate.

6. The ultrasonic cleaning device as set forth in claim 1, further comprising:

transport means capable of consecutively transporting a plurality of said cleaning targets in a single direction, supporting said cleaning targets horizontally, said transport means being provided above said cleaning-liquid-supply means.

7. An ultrasonic cleaning device, comprising:

an ultrasonic cleaning section including cleaning-liquid-supply means for supplying an ultrasonic-applied cleaning liquid to a cleaning target through a cleaning-liquid-supply opening, wherein:

said ultrasonic cleaning section includes a vibrating element for generating ultrasonic vibrations in a cleaning liquid distribution path, at a position on an upstream side to said cleaning-liquid-supply opening, wherein said cleaning-liquid-supply opening is a nozzle opening in a slit form; and a part of the cleaning liquid distribution path located in an immediate downstream of said vibrating element extends in a direction between a horizontal direction and an upward direction, when viewed from an upstream side of the path toward a downstream side thereof, wherein said cleaning-liquid-supply means supplies the cleaning liquid to a lower surface of the cleaning target, the lower surface being opposite to an upper surface of the cleaning target to which an upper surface cleaning liquid is supplied and the ultrasonic vibrations have a frequency in a range of 0.1 MHz to 10 MHz.

8. The ultrasonic cleaning device as set forth in claim 7, further comprising cleaning-liquid-removing means for removing the upper surface cleaning liquid supplied to the upper surface of the cleaning target.

9. The ultrasonic cleaning device as set forth in claim 7, further comprising cleaning liquid heating means.

10. The ultrasonic cleaning device as set forth in claim 7, wherein said cleaning-liquid-supply opening has a gap width of not less than 1 mm and not more than 30 mm.

11. The ultrasonic cleaning device as set forth in claim 7, further comprising transport means capable of consecutively transporting a plurality of said cleaning targets in a single direction, supporting said cleaning targets horizontally, said transport means being provided above said cleaning-liquid-supply means.

* * * * *